(12) United States Patent
Guo et al.

(10) Patent No.: US 12,211,454 B2
(45) Date of Patent: Jan. 28, 2025

(54) DRIVING CIRCUIT, DRIVING METHOD, DISPLAY SUBSTRATE AND DISPLAY DEVICE WITH NODE CONTROL CIRCUIT FOR CONTROLLING POTENTIAL OF NODE

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Jiandong Guo, Beijing (CN); Zhongshan Wu, Beijing (CN); Xiaoyuan Wang, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 20 days.

(21) Appl. No.: 18/026,642

(22) PCT Filed: Mar. 4, 2022

(86) PCT No.: PCT/CN2022/079292
§ 371 (c)(1),
(2) Date: Mar. 16, 2023

(87) PCT Pub. No.: WO2022/267537
PCT Pub. Date: Dec. 29, 2022

(65) Prior Publication Data
US 2023/0335065 A1    Oct. 19, 2023

(30) Foreign Application Priority Data

Jun. 22, 2021  (CN) .......................... 202110692448.4

(51) Int. Cl.
*G09G 3/3291*   (2016.01)
*G06F 3/041*    (2006.01)

(52) U.S. Cl.
CPC ......... *G09G 3/3291* (2013.01); *G06F 3/0412* (2013.01)

(58) Field of Classification Search
CPC ............................ G09G 3/3291; G06F 3/0412
See application file for complete search history.

(56) References Cited

U.S. PATENT DOCUMENTS 9,766,741 B2*  9/2017  Zhao .................... G09G 3/3677
10,261,620 B2*  4/2019  Pan ....................... G06F 3/0412
(Continued)

FOREIGN PATENT DOCUMENTS

CN    104021769 A    9/2014
CN    104795041 A    7/2015
(Continued)

*Primary Examiner* — Afroza Chowdhury
(74) *Attorney, Agent, or Firm* — WHDA, LLP

(57) ABSTRACT

A driving circuit, a driving method, a display substrate and a display device are provided. The driving circuit includes a first node control circuit, a second node control circuit, a third node control circuit and an output circuit; the first node control circuit controls the potential of the first node; the second node control circuit controls the potential of the second node; the third node control circuit controls, under the control of the on-off control signal, the first node to be electrically connected to the third node or the first node to be electrically disconnected from the third node; the output circuit controls, under the control of the potential of the second node and the potential of the third node, output of the driving signal through the driving signal terminal.

19 Claims, 10 Drawing Sheets

(56) References Cited

U.S. PATENT DOCUMENTS

| | | | |
|---|---|---|---|
| 10,943,554 B2* | 3/2021 | Wang | G09G 3/20 |
| 11,205,726 B2* | 12/2021 | Yu | H01L 29/41733 |
| 2016/0266699 A1 | 9/2016 | Zhao et al. | |
| 2016/0328076 A1 | 11/2016 | Pan | |
| 2020/0143731 A1* | 5/2020 | Zheng | G09G 3/20 |
| 2020/0356203 A1 | 11/2020 | Wang et al. | |
| 2021/0167217 A1 | 6/2021 | Yu et al. | |
| 2021/0407358 A1* | 12/2021 | Feng | G11C 19/28 |

FOREIGN PATENT DOCUMENTS

| | | |
|---|---|---|
| CN | 108257567 A | 7/2018 |
| CN | 210535674 U | 5/2020 |
| JP | 2019-040027 A | 3/2019 |

\* cited by examiner

DRIVING CIRCUIT, DRIVING METHOD, DISPLAY SUBSTRATE AND DISPLAY DEVICE WITH NODE CONTROL CIRCUIT FOR CONTROLLING POTENTIAL OF NODE

CROSS REFERENCE OF RELATED APPLICATION

The present application is the U.S. national phase of PCT Application No. PCT/CN2022/079292 filed on Mar. 4, 2022, which claims a priority of Chinese patent application No. 202110692448.4 filed in China on Jun. 22, 2021, both of which are incorporated herein by reference in their entireties.

TECHNICAL FIELD

The present disclosure relates to the technical field of touch display, and in particular to a driving circuit, a driving method, a display substrate and a display device.

BACKGROUND

At present, the development trend of electronic products is light and thin, with diversified functions, and the design challenges for display products are also getting higher and higher. With the continuous popularization of active pens applied in display products, embedded touch technology is widely used.

During the LHB (Long Horizontal Blank, intra-frame touch detection) period of the known driving circuit applied to the touch display product, the first node is in a floating state. Due to the electricity leakage of the transistor of the first node electrically connected to the first electrode or the second electrode (especially in a case that the a-Si (amorphous silicon) transistor is used in the driving circuit, when the gate-source voltage of the a-Si transistor is 0, the leakage current is large), the potential of the first node after being out of the pit (that is, ending of the touch phase) will be lower than that of the first node in a normal row, resulting in reduced gate electrode driving capability after being out of the pit, insufficient pixel charging capacity, and occurrence of horizontal stripes during the LHB. As a result, the touch display product cannot display properly after the touch phase ends.

SUMMARY

In one aspect, an embodiment of the present disclosure provides a driving circuit, including a first node control circuit, a second node control circuit, a third node control circuit and an output circuit,
wherein the first node control circuit is electrically connected to a first node, and configured for controlling a potential of the first node;
the second node control circuit is electrically connected to a second node, and configured for controlling a potential of the second node;
the third node control circuit is electrically connected to an on-off control line, the first node and a third node respectively, and configured for controlling, under control of an on-off control signal provided by the on-off control line, the first node to be electrically connected to the third node or the first node to be electrically disconnected from the third node;
the output circuit is electrically connected to the second node, the third node and a driving signal terminal, and configured for controlling, under control of the potential of the second node and the potential of the third node, output of a driving signal through the driving signal terminal.

Optionally, the third node control circuit includes a first transistor,
wherein a gate electrode of the first transistor is electrically connected to the on-off control line, a first electrode of the first transistor is electrically connected to the first node, and a second electrode of the first transistor is electrically connected to the third node.

Optionally, the on-off control line includes a first on-off control line and a second on-off control line; the third node control circuit includes a first control sub-circuit and a second control sub-circuit;
the first control sub-circuit is electrically connected to the first on-off control line, the first node and the third node, and configured for controlling, under control of a first on-off control signal provided by the first on-off control line, the first node to be electrically connected to the third node or the first node to be electrically disconnected from the third node;
the second control sub-circuit is electrically connected to the second on-off control line, the first node and the third node, and configured for controlling, under control of a second on-off control signal provided by the second on-off control line, the first node to be electrically connected to the third node or the first node to be electrically disconnected from the third node.

Optionally, the first control sub-circuit includes a first transistor, and the second control sub-circuit includes a second transistor;
a gate electrode of the first transistor is electrically connected to the first on-off control line, a first electrode of the first transistor is electrically connected to the first node, and a second electrode of the first transistor is electrically connected to the third node;
a gate electrode of the second transistor is electrically connected to the second on-off control line, a first electrode of the second transistor is electrically connected to the first node, and a second electrode of the second transistor is electrically connected to the third node.

Optionally, the output circuit includes a third transistor, a fourth transistor and a storage capacitor;
a gate electrode of the third transistor is electrically connected to the third node, a second electrode of the third transistor is electrically connected to a clock signal line, and a first electrode of the third transistor is electrically connected to the driving signal terminal;
a gate electrode of the fourth transistor is electrically connected to the second node, a first electrode of the fourth transistor is electrically connected to the driving signal terminal, and a second electrode of the fourth transistor is electrically connected to a first voltage line;
a first plate of the storage capacitor is electrically connected to the third node, and a second plate of the storage capacitor is electrically connected to the driving signal terminal.

Optionally, the output circuit further includes a fifth transistor;
a gate electrode of the fifth transistor is electrically connected to a frame reset line, a second electrode of the fifth transistor is electrically connected to the driving signal terminal, and a first electrode of the fifth transistor is electrically connected to the first voltage line.

Optionally, the second node control circuit includes a fourth node control sub-circuit and a second node control sub-circuit;

the fourth node control sub-circuit is electrically connected to a second voltage line, a fourth node and a first voltage line, and the fourth node control sub-circuit is further electrically connected to the first node or the third node, and configured for controlling, under control of a second voltage signal provided by the second voltage line, the fourth node to be electrically connected to the second voltage line, and controlling, under control of the potential of the first node or the potential of the third node, the fourth node to be electrically connected to the first voltage line;

the second node control sub-circuit is electrically connected to the fourth node, the second voltage line, the second node and the first voltage line, and the second node control sub-circuit is further electrically connected to the first node or the third node, and configured for controlling, under control of a potential of the fourth node, the second node to be electrically connected to the second voltage line, and controlling, under control of the potential of the first node or the potential of the third node, the second node to be electrically connected to the first voltage line.

Optionally, the fourth node control sub-circuit includes a sixth transistor and a seventh transistor;

a gate electrode of the sixth transistor is electrically connected to a first electrode of the sixth transistor and the second voltage line, and a second electrode of the sixth transistor is electrically connected to the fourth node;

a gate electrode of the seventh transistor is electrically connected to the first node or the third node, a first electrode of the seventh transistor is electrically connected to the fourth node, and a second electrode of the seventh transistor is electrically connected to the first voltage line;

the second node control sub-circuit includes an eighth transistor and a ninth transistor;

a gate electrode of the eighth transistor is electrically connected to the fourth node, a first electrode of the eighth transistor is electrically connected to the second voltage line, and a second electrode of the eighth transistor is electrically connected to the second node;

a gate electrode of the ninth transistor is electrically connected to the first node or the third node, a first electrode of the ninth transistor is electrically connected to the second node, and a second electrode of the ninth transistor is electrically connected to the first voltage line.

Optionally, the first node control circuit is electrically connected to an input terminal, a reset terminal, a frame reset line, the second node, the first node and a first voltage line, and configured for controlling, under control of an input signal provided by the input terminal, the input terminal to be electrically connected to the first node, controlling, under control of a reset signal provided by the reset terminal, the first node to be electrically connected to the first voltage line, controlling, under control of the potential of the second node, the first node to be electrically connected to the first voltage line, and controlling, under control of a frame reset signal provided by the frame reset line, the first node to be electrically connected to the first voltage line.

Optionally, the first node control circuit includes a tenth transistor, an eleventh transistor, a twelfth transistor and a thirteenth transistor;

a gate electrode of the tenth transistor and a first electrode of the tenth transistor are both electrically connected to the input terminal, and a second electrode of the tenth transistor is electrically connected to the first node;

a gate electrode of the eleventh transistor is electrically connected to the reset terminal, a first electrode of the eleventh transistor is electrically connected to the first node, and a second electrode of the eleventh transistor is electrically connected to the first voltage line;

a gate electrode of the twelfth transistor is electrically connected to the second node, a first electrode of the twelfth transistor is electrically connected to the first node, a second electrode of the twelfth transistor is electrically connected to the first voltage line;

a gate electrode of the thirteenth transistor is electrically connected to the frame reset line, a first electrode of the thirteenth transistor is electrically connected to the first node, and a second electrode of the thirteenth transistor is electrically connected to the first voltage line.

The embodiment of the present disclosure also provides a driving method, performed by the above-mentioned driving circuit, wherein the driving method includes:

in a display stage, controlling, by the third node control circuit under control of the on-off control signal, the first node to be electrically connected to the third node;

in a touch stage, controlling, by the third node control circuit under control of the on-off control signal, the first node to be electrically disconnected from the third node.

Optionally, the on-off control line includes the first on-off control line and the second on-off control line, and the third node control circuit includes the first control sub-circuit and the second control sub-circuit;

the step of controlling, by the third node control circuit under control of the on-off control signal, the first node to be electrically disconnected from the third node includes:

controlling, by the first control sub-circuit under control of the first on-off control signal, the first node to be electrically disconnected from the third node, and controlling, by the second control sub-circuit under control of the second on-off control signal, the first node to be electrically disconnected from the third node.

The embodiment of present disclosure also provides a display substrate, including a display region arranged on a substrate and a driving module arranged on a peripheral region of the substrate, where the driving module includes multi-stage driving circuits, each of the multi-stage driving circuits is the above-mentioned driving circuit;

the third node control circuit is arranged at a side of the output circuit distal to the display region, and the on-off control line is arranged at a side of the third node control circuit distal to the output circuit.

Optionally, the third node control circuit includes the first transistor;

the first transistor includes a comb-shaped first electrode and a comb-shaped second electrode arranged at a same layer;

the first electrode of the first transistor includes a plurality of first comb-tooth electrode parts and a first comb-handle electrode part connected to the plurality of first comb-tooth electrode parts;

the second electrode of the first transistor includes a plurality of second comb-tooth electrode parts and a second comb-handle electrode part connected to the plurality of second comb-tooth electrode parts;

the first comb-tooth electrode parts and the second comb-tooth electrode parts are arranged at intervals.

Optionally, the on-off control line extends in a first direction; the first transistor further includes a gate electrode, and the gate electrode and the on-off control line are arranged at a same layer; the display substrate further includes a first conductive connection part, a second conductive connection part, a first conductive transfer part and a second conductive transfer part;

the first conductive connection part and the gate electrode of the first transistor are arranged at a same layer and electrically connected to each other, the second conductive connection part and the first electrode of the first transistor are arranged at a same layer, the first conductive transfer part and the second conductive transfer part are arranged at a same layer, the first conductive transfer part, the first conductive connection part and the second conductive connection part are arranged at respective different layers;

the on-off control line is electrically connected to the first conductive transfer part through a first via hole, and the first conductive transfer part is electrically connected to the second conductive connection part through a second via hole, the second conductive connection part is electrically connected to the second conductive transfer part through a third via hole, and the second conductive transfer part is electrically connected to the first conductive connection part through a fourth via hole, so that the gate electrode of the first transistor is electrically connected to the on-off control line.

Optionally, the driving circuit further includes a fourth transistor and a twelfth transistor;

the first transistor and the fourth transistor are arranged in a first direction, or the first transistor and the twelfth transistor are arranged in the first direction.

Optionally, the third node control circuit further includes the second transistor; the second transistor includes a comb-shaped first electrode and a comb-shaped second electrode; the first electrode of the first transistor, the first electrode of the second transistor, and the second electrode of the second transistor are arranged at a same layer;

the first electrode of the second transistor includes a plurality of third comb-tooth electrode parts and a third comb-handle electrode part connected to the plurality of third comb-tooth electrode parts;

the second electrode of the second transistor includes a plurality of fourth comb-tooth electrode parts and a fourth comb-handle electrode part connected to the plurality of fourth comb-tooth electrode parts;

the third comb-tooth electrode parts and the fourth comb-tooth electrode parts are arranged at intervals;

the third comb-handle electrode part is electrically connected to the first comb-handle electrode part, and the fourth comb-handle electrode part is electrically connected to the second comb-handle electrode part.

Optionally, the first transistor and the second transistor are arranged in a second direction;

the second direction and the first direction intersects each other.

Optionally, the on-off control line includes the first on-off control line and the second on-off control line arranged at a same layer; the first on-off control line extends in the first direction, the second on-off control line extends in the first direction;

the first transistor and the second transistor further include the respective gate electrodes, and the gate electrode and the first on-off control line are arranged at a same layer; the display substrate further includes the first conductive connection part, a second conductive connection part, the first conductive transfer part, the second conductive transfer part, the third conductive connection part, the fourth conductive connection part, the third conductive transfer part and the fourth conductive transfer part; the first conductive transfer part, the second conductive transfer part, the third conductive transfer part and the fourth conductive transfer part are arranged at a same layer;

the first conductive connection part and the gate electrode of the first transistor are arranged at a same layer and electrically connected to each other, the second conductive connection part and the first electrode of the first transistor are arranged at a same layer, and the first conductive transfer part, the first conductive connection part and the second conductive connection part are arranged at respective different layers;

the first on-off control line is electrically connected to the first conductive transfer part through the first via hole, and the first conductive transfer part is electrically connected to the second conductive connection part through the second via hole, the second conductive connection part is electrically connected to the second conductive transfer part through a third via hole, and the second conductive transfer part is electrically connected to the first conductive connection part through a fourth via hole, so that the gate electrode of the first transistor is electrically connected to the first on-off control line;

the third conductive connection part and the gate electrode of the second transistor are arranged at a same layer and electrically connected to each other, the fourth conductive connection part and the first electrode of the second transistor are arranged at a same layer, and the third conductive transfer part, the third conductive connection part and the fourth conductive connection part are arranged at respective different layers;

the second on-off control line is electrically connected to the third conductive transfer part through a fifth via hole, and the third conductive transfer part is electrically connected to the fourth conductive connection part through a sixth via hole, the fourth conductive connection part is electrically connected to the fourth conductive transfer part through a seventh via hole, and the fourth conductive transfer part is electrically connected to the third conductive connection part through an eighth via hole, so that the gate electrode of the second transistor is electrically connected to the second on-off control line.

Optionally, the driving circuit further includes a fourth transistor and a twelfth transistor;

the first transistor and the fourth transistor are arranged in the first direction, and the second transistor and the twelfth transistor are arranged in the first direction; or, the first transistor and the twelfth transistor are arranged in the first direction, and the second transistor and the fourth transistor are arranged in the first direction.

The embodiment of the present disclosure also provides a display device, which includes the above-mentioned driving circuit or the above-mentioned display substrate.

DETAILED DESCRIPTION

The present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

All transistors adopted in the embodiments of the present disclosure may be triodes, thin film transistors (TFT), field effect transistors (FETs) or any other elements having an identical characteristic. In the embodiments of the present disclosure, in order to differentiate two electrodes other than a gate electrode from each other, one of the two electrodes is called as first electrode and the other is called as second electrode.

In actual use, when the transistor is a TFT or FET, the first electrode may be a drain electrode and the second electrode may be a source electrode, or the first electrode may be a source electrode and the second electrode may be a drain electrode.

Figure 1:
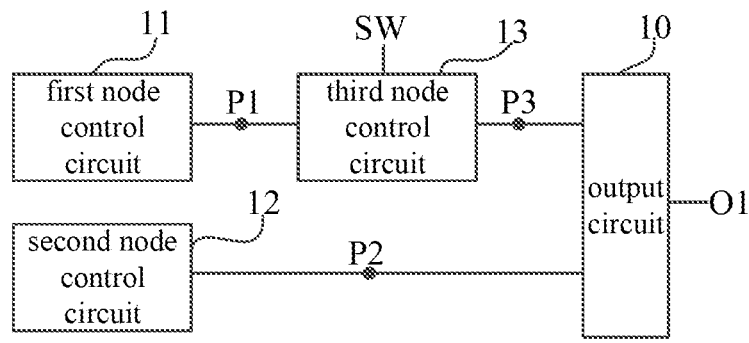
FIG. 1 is a structural view of a driving circuit described in an embodiment of the present disclosure.

As shown in FIG. 1, the driving circuit described in the embodiment of the present disclosure includes a first node control circuit 11, a second node control circuit 12, a third node control circuit 13 and an output circuit 10;

the first node control circuit 11 is electrically connected to the first node P1, and configured for controlling the potential of the first node P1;

the second node control circuit 12 is electrically connected to the second node P2, and configured for controlling the potential of the second node P2;

the third node control circuit 13 is electrically connected to an on-off control line SW, the first node P1 and a third node P3, and configured for controlling, under control of an on-off control signal provided by the on-off control line SW, the first node P1 to be electrically connected to, or disconnected from, the third node P3;

the output circuit 10 is electrically connected to the second node P2, the third node P3 and a driving signal terminal O1, and configured for controlling, under control of the potential of the second node P2 and the potential of the third node P3, output of a driving signal through the driving signal terminal O1.

In a case that the embodiment of the driving circuit shown in FIG. 1 of the present disclosure is implemented, in a touch stage, under the control of the on-off control signal, the third node control circuit 13 controls the first node P1 to be electrically disconnected from the third node P3, and blocks the electricity leakage path of the third node P3, so that the potential of the third node P3 can be always maintained in the touch stage; and in a display stage, under the control of the on-off control signal, the third node control circuit 13 controls the first node P1 be electrically connected to the third node P3, so as to perform the proper display driving.

In the embodiments of the present disclosure, the following problem can be solved: in a case that the period of the touch stage lasts too long, the high potential of the third node P3 cannot be maintained, thereby resulting in failure of proper display after the touch stage ends. The embodiments of the present disclosure can meet the requirements of different active pen protocols on the touch time, which has wide applicability, and enhances the competitiveness of the touch display product.

The electricity leakage path of P3 is broken in the embodiment of the present disclosure, so that in the touch display product, especially the touch display product supporting the active pen, the potential of the third node can be maintained at a high voltage after the touch phase ends, thereby the touch display product may properly output the driving signal. In the embodiments of the present disclosure, it solves the problem of the horizontal stripes in LHB (Long Horizontal Blank, intra-frame touch detection) mode, which are applicable to such products as a mobile terminal and a notebook computer, but are not limited thereto.

Optionally, the third node control circuit includes a first transistor;

a gate electrode of the first transistor is electrically connected to the on-off control line, a first electrode of the first transistor is electrically connected to the first node, and a second electrode of the first transistor is electrically connected to the third node.

Figure 2:
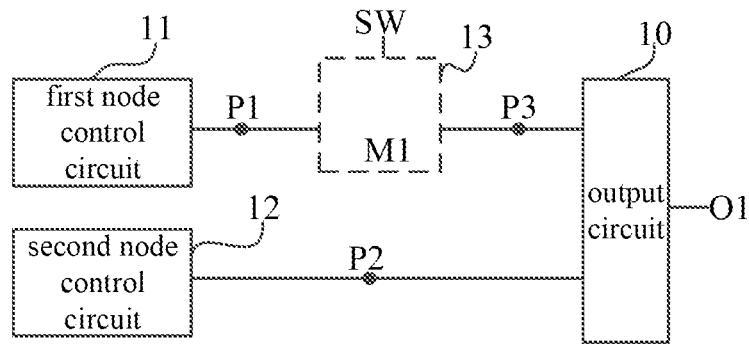
FIG. 2 is a structural view of the driving circuit described in an embodiment of the present disclosure.

As shown in FIG. 2, on the basis of the embodiment of the driving circuit shown in FIG. 1, the third node control circuit 13 includes a first transistor M1;

the gate electrode of M1 is electrically connected to the on-off control line SW, the first electrode of M1 is electrically connected to the first node P1, and the second electrode of M1 is electrically connected to the third node P3;

the M1 is an n-type transistor.

In a case that the embodiment of the driving circuit shown in FIG. 2 is implemented, in the display stage, the SW outputs a high-voltage signal, and M1 is turned on; and in the touch stage, the SW outputs a low-voltage signal, and M1 is turned off.

In at least one embodiment of the driving circuit shown in FIG. 2, M1 may be an a-Si TFT (amorphous silicon thin-film transistor). Since the a-Si TFT is in a positive bias state for a long time, characteristic curve thereof will shift to the right, resulting in a decrease in the turn-on current Ion. When the ratio of the duration of the display phase to the duration of the touch phase is greater than 1, M1 will be in a positive bias state. In a long-term working or reliable condition, the characteristic curve of M1 may shift to the right, which will cause the turn-on current Ion to drop, resulting in insufficient driving signal output. To avoid the above-mentioned problem, in at least one embodiment of the present disclosure, two control sub-circuits included in the third node control circuit alternately operate in the display phase, so as to prevent the transistors included in the control sub-circuits from being in a positive bias state for a long time.

In at least one embodiment of the present disclosure, the on-off control line may include a first on-off control line and a second on-off control line; the third node control circuit may include a first control sub-circuit and a second control sub-circuit;

the first control sub-circuit is electrically connected to the first on-off control line, the first node and the third node, and configured for controlling, under the control of a first on-off control signal provided by the first on-off control line, the first node to be electrically connected to the third node or the first node to be electrically disconnected from the third node;

the second control sub-circuit is electrically connected to the second on-off control line, the first node and the third node, and configured for controlling, under the control of a second on-off control signal provided by the second on-off control line, the first node to be electrically connected to the third node or the first node to be electrically disconnected from the third node.

In a preferred situation, two on-off control lines may be used, and the third node control circuit may include two control sub-circuits. In the display stage, the two control sub-circuits operate alternately (e.g., at every frame or every 2 s), so as to prevent the transistors included in the control sub-circuits from being in a positive bias state for a long time, and to ensure the service life of the product.

Figure 3:
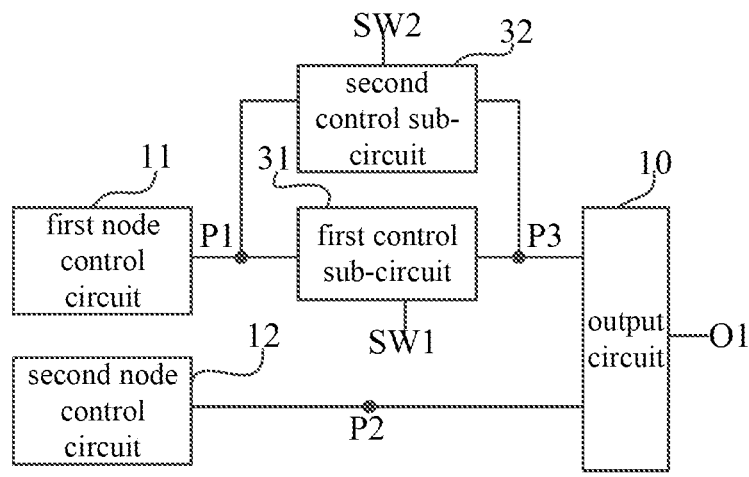
FIG. 3 is a structural view of the driving circuit described in an embodiment of the present disclosure.

As shown in FIG. 3, on the basis of the embodiment of the driving circuit shown in FIG. 1, the on-off control line may include a first on-off control line SW1 and a second on-off control line SW2;

the third node control circuit includes a first control sub-circuit 31 and a second control sub-circuit 32;

the first control sub-circuit 31 is electrically connected to the first on-off control line SW1, the first node P1 and the third node P3, and configured for controlling, under control of a first on-off control signal provided by the first on-off control line SW1, the first node P1 to be electrically connected to, or disconnected from, the third node P3;

the second control sub-circuit 32 is electrically connected to the second on-off control line SW2, the first node P1 and the third node P3, and configured for controlling, under the control of a second on-off control signal provided by the second on-off control line SW2, the first node P1 to be electrically connected to, or disconnected from, the third node P3.

In a case that at least one embodiment of the driving circuit shown in FIG. 3 of the present disclosure is implemented, in the touch stage, the first control sub-circuit 31 controls, under the control of the first on-off control signal, the first node P1 to be disconnected from the third node P3, and the second control sub-circuit 32 controls, under the control of the second on-off control signal, the first node P1 to be disconnected from the third node P3;

in the display stage, in every frame or 2 s, the first control sub-circuit 31 and the second control sub-circuit operate alternately to control the first node P1 to be electrically connected to the third node P3.

Optionally, the first control sub-circuit includes a first transistor, and the second control sub-circuit includes a second transistor;

a gate electrode of the first transistor is electrically connected to the first on-off control line, a first electrode of the first transistor is electrically connected to the first node, and a second electrode of the first transistor is electrically connected to the third node;

a gate electrode of the second transistor is electrically connected to the second on-off control line, a first electrode of the second transistor is electrically connected to the first node, and a second electrode of the second transistor is electrically connected to the third node.

Figure 4:
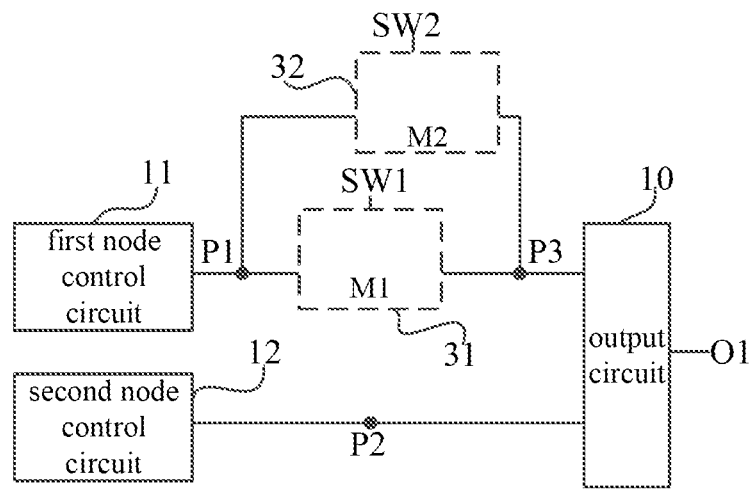
FIG. 4 is a structural view of the driving circuit described in an embodiment of the present disclosure.

As shown in FIG. 4, on the basis of at least one embodiment of the driving circuit shown in FIG. 3, the first control sub-circuit 31 includes a first transistor M1, and the second control sub-circuit 32 includes a second transistor M2;

a gate electrode of the first transistor M1 is electrically connected to the first on-off control line SW1, a first electrode of the first transistor M1 is electrically connected to the first node P1, and a second electrode of the first transistor M1 is electrically connected to the third node P3;

a gate electrode of the second transistor M2 is electrically connected to the second on-off control line SW2, a first electrode of the second transistor M2 is electrically connected to the first node P1, and a second electrode of the second transistor M2 is electrically connected to the third node P3.

In at least one embodiment shown in FIG. 4, both M1 and M2 may be n-type transistors.

In a case that at least one embodiment of the present disclosure as shown in FIG. 4 is implemented, in the touch stage, both SW1 and SW2 output low-voltage signals, and M1 and M2 are turned off;

the display stage may include a plurality of display time periods, each display time period includes a first display time period and a second display time period arranged sequentially in that order;

in the first display time period, SW1 outputs a high-voltage signal, SW2 outputs a low-voltage signal, M1 is turned on, and M2 is turned off to control the first node P1 to be electrically connected to the third node P3; in the second display time period, SW1 outputs a low-voltage signal, and SW2 outputs a high-voltage signal, M1 is turned off, and M2 is turned on to control the first node P1 to be electrically connected to the third node P3; or, in the first display time period, SW2 outputs a high-voltage signal, SW1 outputs a low-voltage signal, M2 is turned on, and M1 is turned off to control the first node P1 to be electrically connected to the third node P3; in the second display time period, SW2 outputs a low-voltage signal, and SW1 outputs a high-voltage signal, M2 is turned off, and M1 is turned onto control the first node P1 to be electrically connected to the third node P3.

Optionally, the output circuit includes a third transistor, a fourth transistor and a storage capacitor;

a gate electrode of the third transistor is electrically connected to the third node, a second electrode of the third transistor is electrically connected to a clock signal line, and a first electrode of the third transistor is electrically connected to the driving signal terminal;

a gate electrode of the fourth transistor is electrically connected to the second node, a first electrode of the fourth transistor is electrically connected to the driving signal terminal, and a second electrode of the fourth transistor is electrically connected to a first voltage line;

a first plate of the storage capacitor is electrically connected to the third node, and a second plate of the storage capacitor is electrically connected to the driving signal terminal.

Optionally, the output circuit further includes a fifth transistor;

a gate electrode of the fifth transistor is electrically connected to a frame reset line, a second electrode of the fifth transistor is electrically connected to the driving signal terminal, and a first electrode of the fifth transistor is electrically connected to the first voltage line.

In the specific embodiment, the second node control circuit may include a fourth node control sub-circuit and a second node control sub-circuit;

the fourth node control sub-circuit is electrically connected to a second voltage line, a fourth node and a first voltage line, and the fourth node control sub-circuit is further electrically connected to the first node or the third node, and configured for controlling, under control of a second voltage signal provided by the second voltage line, the fourth node to be electrically connected to the second voltage line, and controlling, under control of the potential of the first node or the potential of the third node, the fourth node to be electrically connected to the first voltage line;

the second node control sub-circuit is electrically connected to the fourth node, the second voltage line, the second node and the first voltage line, and the second node control sub-circuit is further electrically connected to the first node or the third node, and configured for controlling, under control of a potential of the fourth node, the second node to be electrically connected to the second voltage line, and controlling, under control of the potential of the first node or the potential of the third node, the second node to be electrically connected to the first voltage line.

Figure 5:
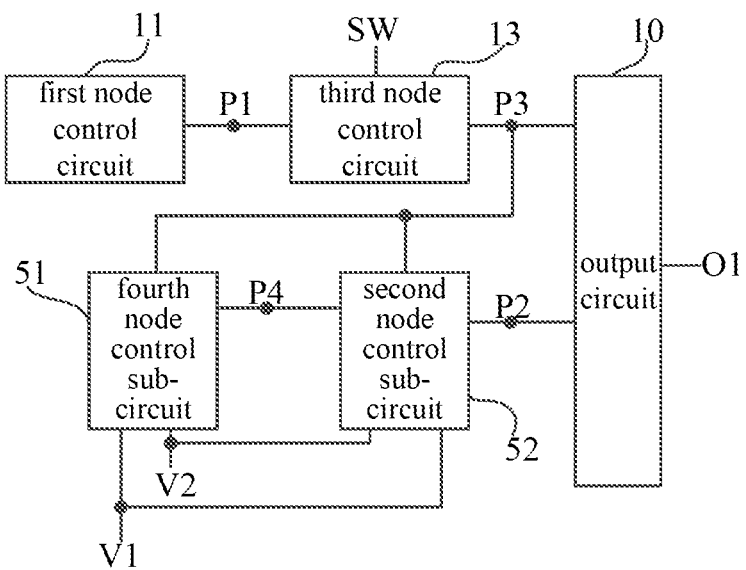
FIG. 5 is a structural view of the driving circuit described in an embodiment of the present disclosure.

As shown in FIG. 5, on the basis of the embodiment of the driving circuit shown in FIG. 1, the second node control circuit may include a fourth node control sub-circuit 51 and a second node control sub-circuit 52;

the fourth node control sub-circuit 51 is electrically connected to a second voltage line V2, a fourth node P4, the third node P3 and a first voltage line V1 respectively, and configured for controlling, under control of a second voltage signal provided by the second voltage line V2, the fourth node P4 to be electrically connected to the second voltage line V2, and controlling, under control of the potential of the third node P3, the fourth node P4 to be electrically connected to the first voltage line V1;

the second node control sub-circuit 52 is electrically connected to the fourth node P4, the second voltage line V2, the second node P2, the third node P3 and the first voltage line V1, and configured for controlling, under control of a potential of the fourth node P4, the second node P2 to be electrically connected to the second voltage line V2, and controlling, under control of the potential of the third node P3, the second node P2 to be electrically connected to the first voltage line V1.

In at least one embodiment of the present disclosure, the second voltage line may be a high-voltage line, and the first voltage line may be a low-voltage line, but the present disclosure is not limited thereto.

In a case that at least one embodiment of the driving circuit shown in FIG. 5 of the present disclosure is implemented, the fourth node control sub-circuit 51 controls the potential of the fourth node P4, and the second node control sub-circuit 52 controls the potential of the second node P2.

Figure 6:
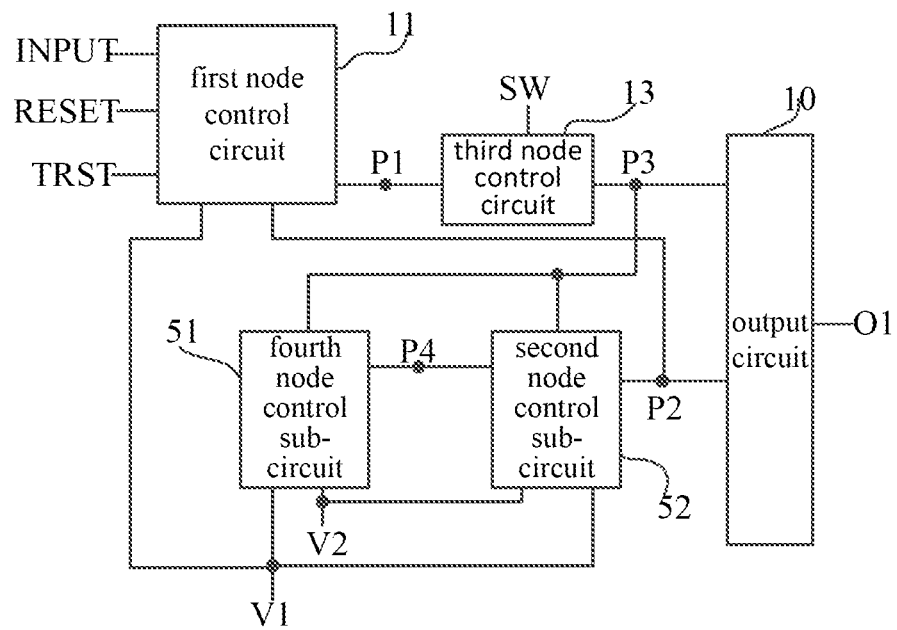
FIG. 6 is a structural view of the driving circuit described in an embodiment of the present disclosure.

As shown in FIG. 6, on the basis of the embodiment of the driving circuit shown in FIG. 1, the second node control circuit may include a fourth node control sub-circuit 51 and a second node control sub-circuit 52;

the fourth node control sub-circuit 51 is electrically connected to a second voltage line V2, a fourth node P4, the first node P1 and a first voltage line V1, and configured for controlling, under control of a second voltage signal provided by the second voltage line V2, the fourth node P4 to be electrically connected to the second voltage line V2, and controlling, under control of the potential of the first node P1, the fourth node P4 to be electrically connected to the first voltage line V1;

the second node control sub-circuit 52 is electrically connected to the fourth node P4, the second voltage line V2, the second node P2, the first node P1 and the first voltage line V1, and configured for controlling, under control of a potential of the fourth node P4, the second node P2 to be electrically connected to the second voltage line V2, and controlling, under control of the potential of the first node P1, the second node P2 to be electrically connected to the first voltage line V1.

In at least one embodiment of the present disclosure, the second voltage line may be a high-voltage line, and the first voltage line may be a low-voltage line, but the present disclosure is not limited thereto.

In a case that at least one embodiment of the driving circuit shown in FIG. 6 of the present disclosure is implemented, the fourth node control sub-circuit 51 controls the potential of the fourth node P4, and the second node control sub-circuit 52 controls the potential of the second node P2.

Optionally, the fourth node control sub-circuit includes a sixth transistor and a seventh transistor;

a gate electrode of the sixth transistor is electrically connected to a first electrode of the sixth transistor and the second voltage line, and a second electrode of the sixth transistor is electrically connected to the fourth node;

a gate electrode of the seventh transistor is electrically connected to the first node or the third node, a first electrode of the seventh transistor is electrically connected to the fourth node, and a second electrode of the seventh transistor is electrically connected to the first voltage line;

the second node control sub-circuit includes an eighth transistor and a ninth transistor;

a gate electrode of the eighth transistor is electrically connected to the fourth node, a first electrode of the eighth transistor is electrically connected to the second voltage line, and a second electrode of the eighth transistor is electrically connected to the second node;

a gate electrode of the ninth transistor is electrically connected to the first node or the third node, a first electrode of the ninth transistor is electrically connected to the second node, and a second electrode of the ninth transistor is electrically connected to the first voltage line.

In at least one embodiment of the present disclosure, the first node control circuit is electrically connected to an input terminal, a reset terminal, a frame reset line, the second node, the first node and a first voltage line, and configured for controlling, under control of an input signal provided by the input terminal, the input terminal to be electrically connected to the first node, controlling, under control of a reset signal provided by the reset terminal, the first node to be electrically connected to the first voltage line, controlling, under control of the potential of the second node, the first node to be electrically connected to the first voltage line, and controlling, under control of a frame reset signal provided by the frame reset line, the first node to be electrically connected to the first voltage line.

Figure 7:
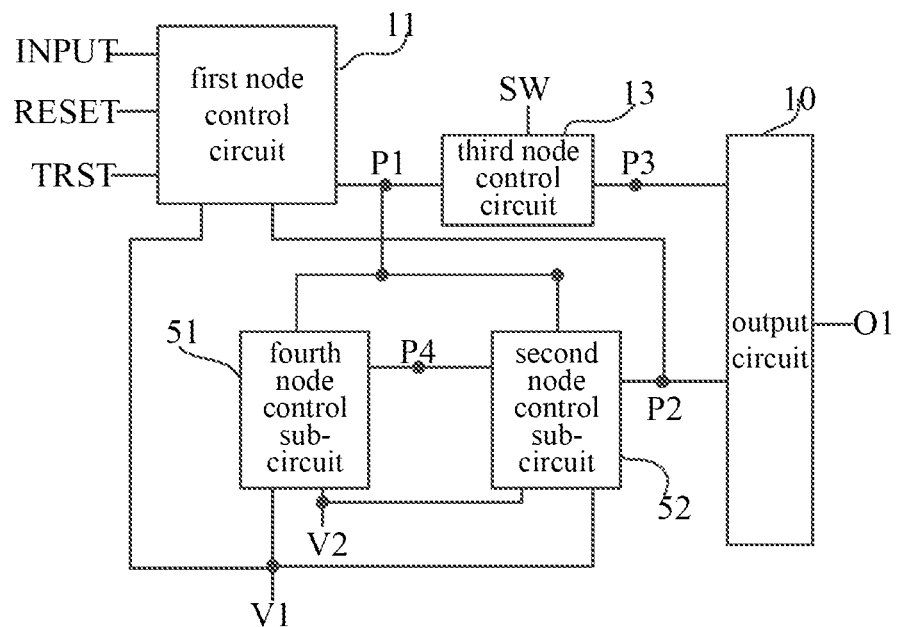
FIG. 7 is a structural view of the driving circuit described in an embodiment of the present disclosure.

As shown in FIG. 7, on the basis of at least one embodiment of the driving circuit shown in FIG. 5, the first node control circuit 11 is electrically connected to an input terminal INPUT, a reset terminal RESET, a frame reset line TRST, the second node P2, the first node P1 and a first voltage line V1, and configured for controlling, under control of an input signal provided by the input terminal INPUT, the input terminal INPUT to be electrically connected to the first node P1, controlling, under control of a reset signal provided by the reset terminal RESET, the first node P1 to be electrically connected to the first voltage line V1, controlling, under control of the potential of the second node P2, the first node P1 to be electrically connected to the first voltage line V1, and controlling, under control of a frame reset signal provided by the frame reset line TRST, the first node to be electrically connected to the first voltage line V1.

Optionally, the first node control circuit includes a tenth transistor, an eleventh transistor, a twelfth transistor and a thirteenth transistor;

both a gate electrode of the tenth transistor and a first electrode of the tenth transistor are electrically connected to the input terminal, and a second electrode of the tenth transistor is electrically connected to the first node;

a gate electrode of the eleventh transistor is electrically connected to the reset terminal, a first electrode of the eleventh transistor is electrically connected to the first node, and a second electrode of the eleventh transistor is electrically connected to the first voltage line;

a gate electrode of the twelfth transistor is electrically connected to the second node, a first electrode of the twelfth transistor is electrically connected to the first node, a second electrode of the twelfth transistor is electrically connected to the first voltage line;

a gate electrode of the thirteenth transistor is electrically connected to the frame reset line, a first electrode of the thirteenth transistor is electrically connected to the first node, and a second electrode of the thirteenth transistor is electrically connected to the first voltage line.

Figure 8:
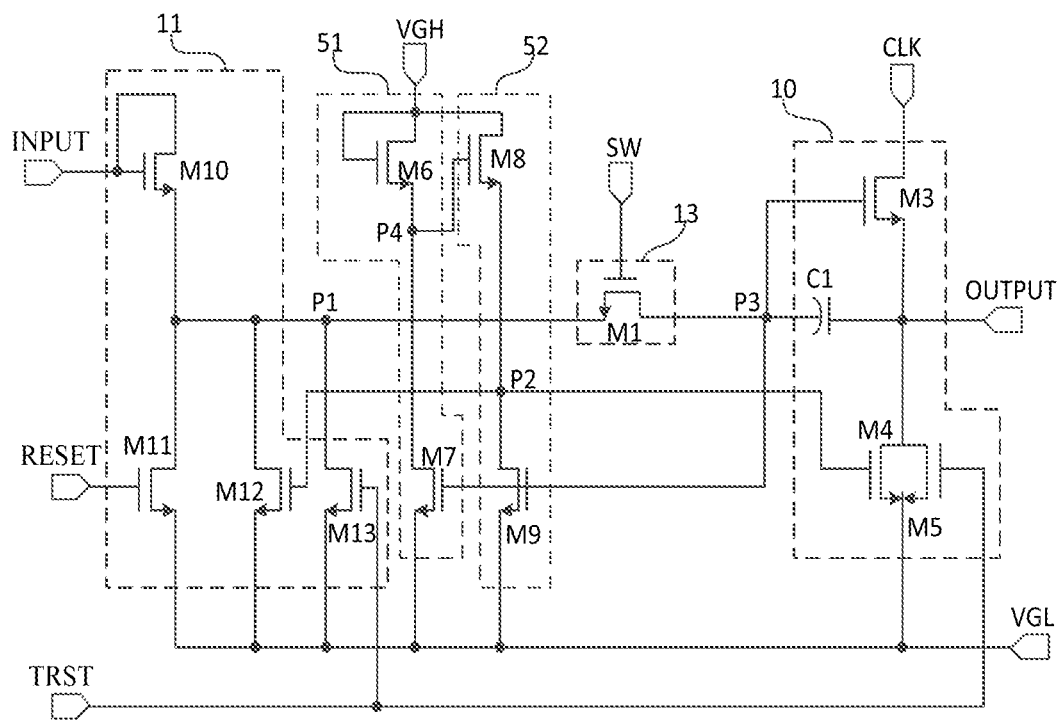
FIG. 8 is a structural view of the driving circuit described in an embodiment of the present disclosure.

As shown in FIG. 8, on the basis of at least one embodiment of the driving circuit shown in FIG. 7, the third node control circuit 13 includes a first transistor M1; the output circuit includes a third transistor M3, a fourth transistor M4 and a storage capacitor C1;

the gate electrode of M1 is electrically connected to the on-off control line SW, the first electrode of M1 is electrically connected to the first node P1, and the second electrode of M1 is electrically connected to the third node P3;

the gate electrode of the third transistor M3 is electrically connected to the third node P3, the second electrode of the third transistor M3 is electrically connected to the clock signal line CLK, and the first electrode of the third transistor M3 is electrically connected to the driving signal terminal OUTPUT;

the gate electrode of the fourth transistor M4 is electrically connected to the second node P2, the first electrode of the fourth transistor M4 is electrically connected to the driving signal terminal OUTPUT, and the second electrode of the fourth transistor M4 is electrically connected to the low-voltage line VGL; the low-voltage line VGL is configured for providing a low-voltage signal;

the first plate of the storage capacitor C1 is electrically connected to the third node P3, and the second plate of the storage capacitor C1 is electrically connected to the driving signal terminal OUTPUT;

the output circuit 10 also includes a fifth transistor M5;

the gate electrode of the fifth transistor M5 is electrically connected to the frame reset line TRST, the second electrode of the fifth transistor M5 is electrically connected to the driving signal terminal OUTPUT, and the first electrode of the fifth transistor M5 is electrically connected to the low-voltage line VGL;

the fourth node control sub-circuit 51 includes a sixth transistor M6 and a seventh transistor M7;

the gate electrode of the sixth transistor M6 is electrically connected to the first electrode of the sixth transistor M6 and the high-voltage line VGH, and the second electrode of the sixth transistor M6 is electrically connected to the fourth node P4; the high-voltage line VGH is configured for providing a high-voltage signal;

the gate electrode of the seventh transistor M7 is electrically connected to the third node P3, the first electrode of the seventh transistor M7 is electrically connected to the fourth node P4, and the second electrode of the seventh transistor M7 is electrically connected to the low-voltage line VGL;

the second node control sub-circuit 52 includes an eighth transistor M8 and a ninth transistor M9;

the gate electrode of the eighth transistor M8 is electrically connected to the fourth node P4, the first electrode of the eighth transistor M8 is electrically connected to the high-voltage line VGH, and the second electrode of the eighth transistor M8 is electrically connected to the second node P2;

the gate electrode of the ninth transistor M9 is electrically connected to the third node P3, the first electrode of the ninth transistor M9 is electrically connected to the second node P2, and the second electrode of the ninth transistor M9 is electrically connected to the low-voltage line VGL;

the first node control circuit 11 includes a tenth transistor M10, an eleventh transistor M11, a twelfth transistor M12 and a thirteenth transistor M13;

both the gate electrode of the tenth transistor M10 and the first electrode of the tenth transistor M10 are electrically connected to the input terminal INPUT, and the second electrode of the tenth transistor M10 is electrically connected to the first node P1;

the gate electrode of the eleventh transistor M11 is electrically connected to the reset terminal RESET, the first electrode of the eleventh transistor M11 is electrically connected to the first node P1, and the second electrode of the eleventh transistor M11 is electrically connected to the low-voltage line VGL;

the gate electrode of the twelfth transistor M12 is electrically connected to the second node P2, the first electrode of the twelfth transistor M12 is electrically connected to the first node P1, and the second electrode of the twelfth transistor M12 is electrically connected to the low-voltage line VGL;

the gate electrode of the thirteenth transistor M13 is electrically connected to the frame reset line TRST, the first electrode of the thirteenth transistor M13 is electrically connected to the first node P1, and the second electrode of the thirteenth transistor M13 is electrically connected to the low-voltage line VGL.

In the embodiment shown in FIG. 8, all transistors are n-type transistors.

In at least one embodiment of the present disclosure, the gate electrode of M7 and the gate electrode of M9 are preferably both electrically connected to the first node P1, so that in the touch phase, M7 and M9 are turned on, so that the potential of P2 is a low voltage; accordingly, it is ensured that M4 is turned off, and the potential of P3 is prevented from dropping due to the electricity leakage of M4 during the touch stage.

In a case that the embodiment of the driving circuit shown in FIG. 8 is implemented, in the display stage, SW outputs a high-voltage signal, and M1 is turned on, so that P1 is electrically connected to P3.

Figure 9:
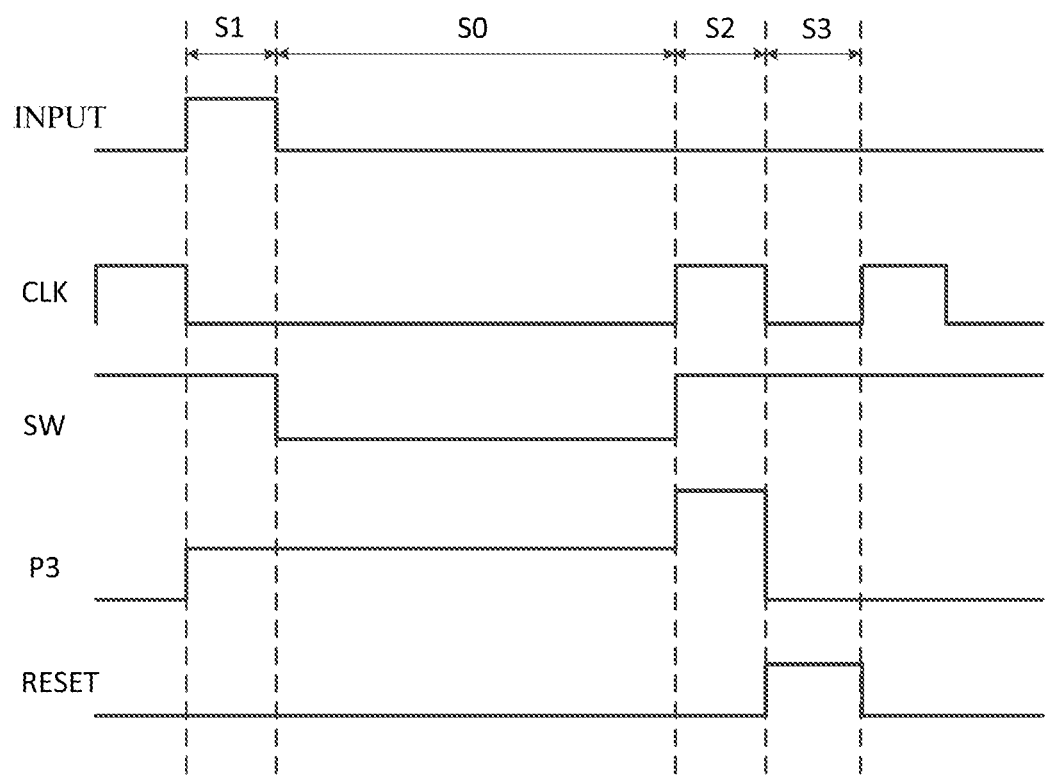
FIG. 9 is a working time sequence view of the embodiment of the driving circuit shown in FIG. 8.

As shown in FIG. 9, in the first time period S1, INPUT outputs a high-voltage signal, M10 is turned on, P1 is precharged through M10, the potential of P1 changes from low voltage to high voltage, and SW outputs a high-voltage signal at the same time, M1 is turned on. P1 and P3 are electrically connected to charge C1 properly; in the touch stage S0, INPUT outputs a low-voltage signal. SW outputs a low-voltage signal, and P1 and P3 are electrically disconnected. Since the electricity leakage path between the P3 and the M10, M11, M13, M12 is broken, the potential of P3 is maintained at a high voltage;

in the second time period S2, the potential of the clock signal provided by the clock signal line CLK changes from low voltage to high voltage, SW outputs a high-voltage signal, P1 and P3 are electrically connected, the potential of P3 is boosted by C1, and M3 is still turned on, OUTPUT outputs properly;

in the third time period S3, RESET provides a high-voltage signal, SW provides a high-voltage signal, the potentials of P1 and P3 are pulled down, and the driving circuit enters a proper display operation state.

Figure 10:
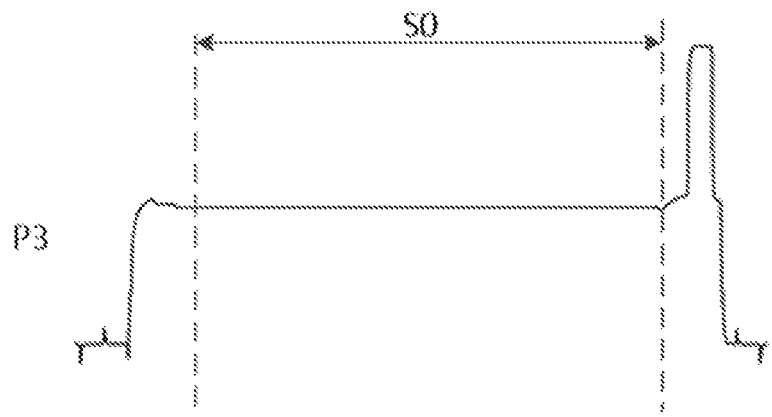
FIG. 10 is a waveform view of a potential of P3 obtained after simulating the embodiment of the driving circuit shown in FIG. 8.

FIG. 10 is a waveform view of the potential of P3 obtained after simulating the embodiment of the driving circuit shown in FIG. 8. In FIG. 10, the label S0 indicates the touch stage. It can be seen from FIG. 10 that in the touch phase S0, the potential of P3 can be maintained at a high voltage.

Figure 11:
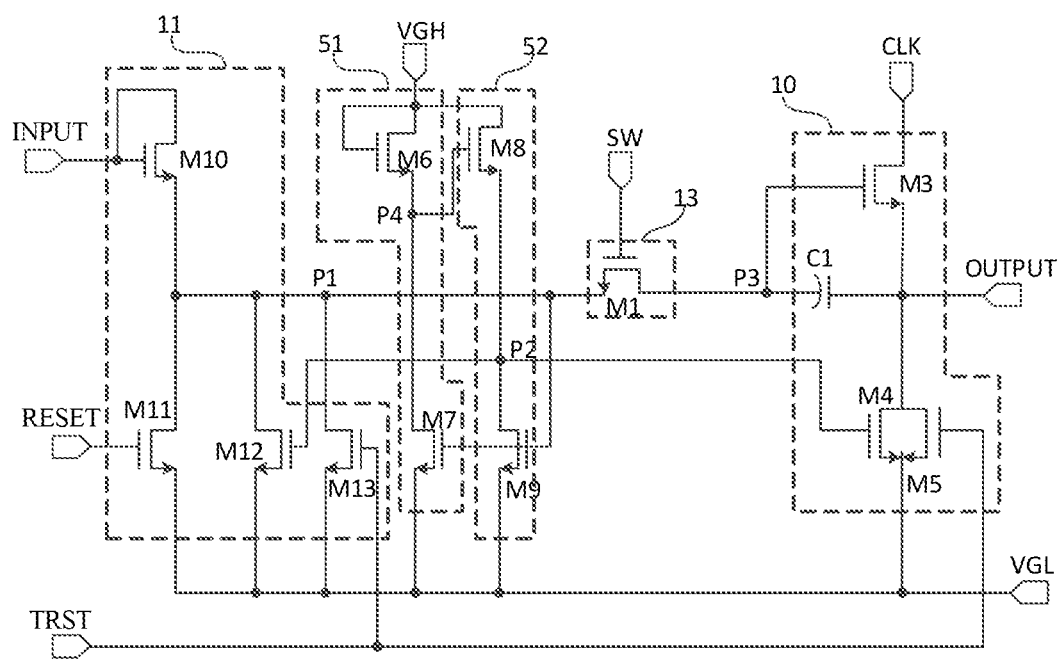
FIG. 11 is a structural view of the driving circuit described in an embodiment of the present disclosure.

The difference between the embodiment of the driving circuit shown in FIG. 11 and the embodiment of the driving circuit shown in FIG. 8 is as follows: the gate electrode of M7 and the gate electrode of M9 are both electrically connected to the first node P1.

Figure 12:
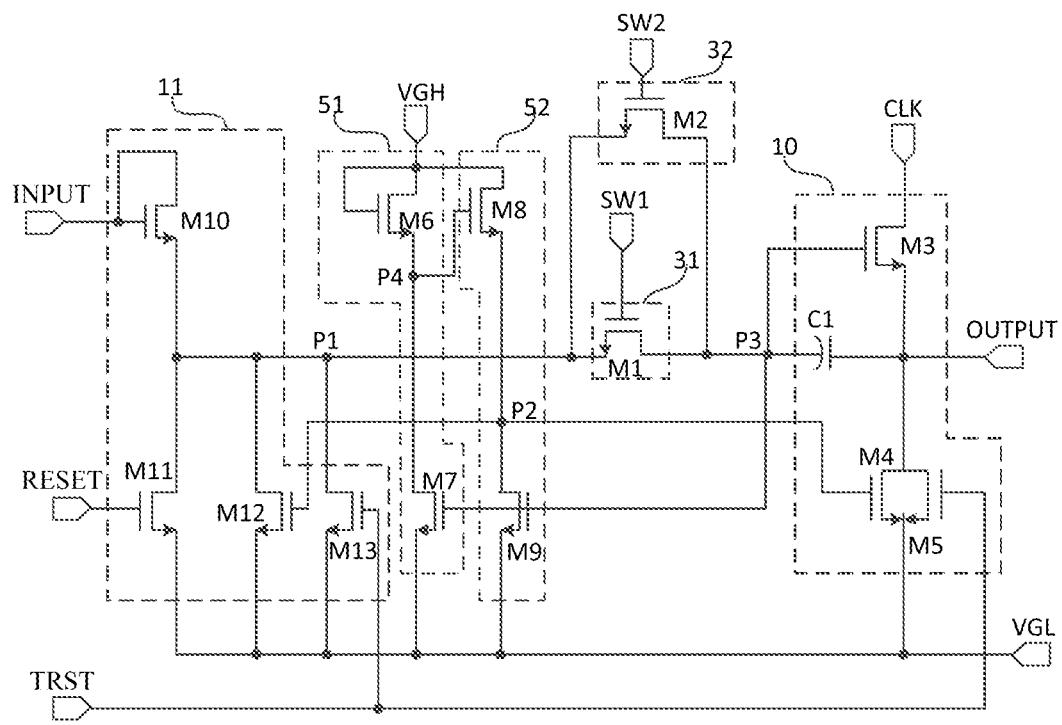
FIG. 12 is a structural view of the driving circuit described in an embodiment of the present disclosure.

The difference between the embodiment of the driving circuit shown in FIG. 12 and the embodiment of the driving circuit shown in FIG. 8 is that: the on-off control line may include a first on-off control line SW1 and a second on-off control line SW2; the third node control circuit includes a first control sub-circuit 31 and a second control sub-circuit 32; the first control sub-circuit 31 includes a first transistor M1, and the second control sub-circuit 32 includes a second transistor M2;

the gate electrode of the first transistor M1 is electrically connected to the first on-off control line SW1, the first electrode of the first transistor M1 is electrically connected to the first node P1, and the second electrode of the first transistor M1 is electrically connected to the third node P3;

the gate electrode of the second transistor M2 is electrically connected to the second on-off control line SW2, the first electrode of the second transistor M2 is electrically connected to the first node P1, and the second electrode of the second transistor M2 is electrically connected to the third node P3.

In the embodiment shown in FIG. 12, all transistors may be n-type transistors.

The difference between the embodiment of the driving circuit shown in FIG. 13 and the embodiment of the driving circuit shown in FIG. 12 is as follows: the gate electrode of M7 and the gate electrode of M9 are both electrically connected to the first node P1.

The present disclosure further provides a driving method for the above-mentioned driving circuit, where the driving method includes:

in a display stage, controlling, by the third node control circuit under control of the on-off control signal, the first node to be electrically connected to the third node; and in a touch stage, controlling, by the third node control circuit under control of the on-off control signal, the first node to be electrically disconnected from the third node.

In the driving method described in the embodiment of the present disclosure, in a touch stage, under the control of the on-off control signal, the third node control circuit controls the first node to be electrically disconnected from the third node, and blocks the electricity leakage path of the third node, so that the potential of the third node can be always maintained in the touch stage; and in a display stage, under the control of the on-off control signal, the third node control circuit controls the first node to be electrically connected to the third node, so as to perform the proper display driving.

In a specific embodiment, the on-off control line may include the first on-off control line and the second on-off control line, and the third node control circuit may include the first control sub-circuit and the second control sub-circuit; the display stage includes a plurality of display time periods, and the display time periods includes a first display time period and a second display time period arranged sequentially in that order; the driving method includes:

in the first display time period, the first control sub-circuit controls, under the control of the first on-off control signal, the first node to be electrically connected to the third node; in the second display time period, the second control sub-circuit controls, under the control of the second on-off control signal, the first node to be electrically connected to the third node; or,
in the first display time period, the second control sub-circuit controls, under the control of the second on-off control signal, the first node to be electrically connected to the third node; in the second display time period, the first control sub-circuit controls, under the control of the first on-off control signal, the first node to be electrically connected to the third node.

In a preferred situation, two on-off control lines may be used, and the third node control circuit may include two control sub-circuits. In the display stage, the two control sub-circuits operate alternately (e.g., at every frame or every 2 s), so as to prevent the transistors included in the control sub-circuits from being in a positive bias state for a long time, and to ensure the service life of the product.

In at least one embodiment of the present disclosure, the step of controlling, by the third node control circuit under control of the on-off control signal, the first node to be electrically disconnected from the third node may include:
controlling, by the first control sub-circuit under control of the first on-off control signal, the first node to be electrically disconnected from the third node, and controlling, by the second control sub-circuit under control of the second on-off control signal, the first node to be electrically disconnected from the third node.

The display substrate described in the embodiment of the present disclosure includes a display region arranged on a substrate and a driving module arranged on a peripheral region of the substrate, where the driving module includes multi-stage driving circuits, each of the multi-stage driving circuits is the above mentioned driving circuit;
the third node control circuit is arranged at a side of the output circuit distal to the display region, and the on-off control line is arranged at a side of the third node control circuit distal to the output circuit.

In the display substrate described in the embodiment of the present disclosure, the pixel circuit is arranged in the display region on the substrate, the driving module is arranged in the peripheral region on the substrate, the output circuit, the third node control circuit and the on-off control line may be arranged in sequence in a direction away from the display region.

In the driving module, the input terminal of the driving circuit is electrically connected to the driving signal terminal of the adjacent previous driving circuit, and the reset terminal of the driving circuit is electrically connected to the driving signal terminal of the next driving circuit.

Optionally, the third node control circuit includes the first transistor;
the first transistor includes a comb-shaped first electrode and a comb-shaped second electrode arranged at a same layer;
the first electrode of the first transistor includes a plurality of first comb-tooth electrode parts and a first comb-handle electrode part connected to the plurality of first comb-tooth electrode parts;
the second electrode of the first transistor includes a plurality of second comb-tooth electrode parts and a second comb-handle electrode part connected to the plurality of second comb-tooth electrode parts;
the first comb-tooth electrode parts and the second comb-tooth electrode parts are arranged at intervals.

In at least one embodiment of the present disclosure, the first transistor may include a comb-shaped first electrode and a comb-shaped second electrode.

Figure 14:
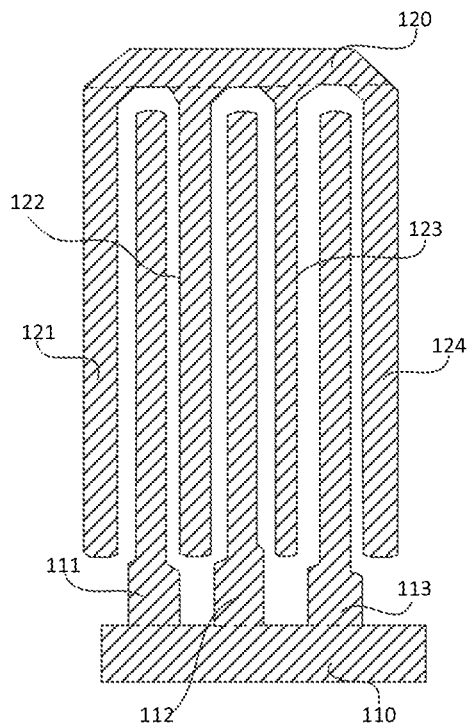
FIG. 14 is a structural view of an embodiment of a first electrode and a second electrode of a first transistor in the driving circuit of a display substrate according to the present disclosure.

As shown in FIG. 14, the first electrode of the fast transistor includes a first comb-tooth electrode part 111 being a first one, a first comb-tooth electrode part 112 being a second one, a first comb-tooth electrode part 113 being a third one and a first comb-handle electrode part 110 that are electrically connected to each other;
the second electrode of the first transistor includes a first second comb-tooth electrode part 121, a second comb-tooth electrode part 122 being a second one, a second comb-tooth electrode part 123 being a third one, a second comb-tooth electrode part 124 being a fourth one and a second comb-handle electrode part 120 that are electrically connected to each other;
the second comb-tooth electrode part 121 being the first one, the first comb-tooth electrode part 111 being the first one, the second comb-tooth electrode part 122 being the second one, the first comb-tooth electrode part 112 being the second one, and the second comb-tooth electrode part 123 being the third one, the first comb-tooth electrode part 113 being the third one and the second comb-tooth electrode part 124 being the fourth one are arranged in sequence in that order in a second direction.

In the embodiment shown in FIG. 14, the second direction is a lateral direction, and gate lines are arranged in the display region, and the gate line includes a part extending in the lateral direction.

The structure shown in FIG. 14 relates to only an embodiment of a structure of the first transistor, and is not intended to limit the structure of the first transistor.

In the specific embodiment, the on-off control line may extend in a first direction; the first transistor further include a gate electrode, and the gate electrode and the on-off control line are arranged at a same layer; the display substrate further include a first conductive connection part, a second conductive connection part, a first conductive transfer part and a second conductive transfer part;
the first conductive connection part and the gate electrode of the first transistor are arranged at a same layer and electrically connected to each other, the second conductive connection part and the first electrode of the first transistor are arranged at a same layer, the first conductive transfer part and the second conductive transfer part are arranged at a same layer, the first conductive transfer part, the first conductive connection part and the second conductive connection part are arranged at respective different layers;
the on-off control line is electrically connected to the first conductive transfer part through a first via hole, and the first conductive transfer part is electrically connected to the second conductive connection part through a second via hole, the second conductive connection part is electrically connected to the second conductive transfer part through a third via hole, and the second conductive transfer part is electrically connected to the first conductive connection part through a fourth via hole, so that the gate electrode of the first transistor is electrically connected to the on-off control line.

In the embodiment of the present disclosure, the first conductive connection part, the on-off control line and the gate electrode of the first transistor are arranged at a same layer, and the second conductive connection part, the first electrode of the first transistor and the second electrode of the first transistor are arranged at a same layer, and the first conductive transfer part and the second conductive transfer part are arranged at a same layer;

the on-off control line is electrically connected to the gate electrode of the first transistor through the first conductive transfer part and the second conductive transfer part.

Optionally, the display substrate may include an active layer, a first insulating layer, a gate metal layer, a second insulating layer, a source/drain metal layer, a third insulating layer, and a conductive layer arranged on the substrate sequentially in that order; the patterning process is performed on the gate metal layer to form the gate electrode of the transistor in the driving circuit, the clock signal line, the high-voltage line, the low-voltage line, the on-off control line and the first conductive connection part, and the patterning process is performed on the source/drain metal layer to form the first electrode of the transistor in the driving circuit, the second electrode of the transistor and the second conductive connection part in the driving circuit, and the patterning process is performed on the conductive layer to form the first conductive transfer part and the second conductive transfer part;

The on-off control line is electrically connected to the first conductive transfer part through the first via hole penetrating through the second insulating layer and the third insulating layer, and the first conductive transfer part is electrically connected to the second conductive connection part through the second via hole penetrating through the third insulating layer, the second conductive connection part is electrically connected to the second conductive transfer part through a third via hole penetrating through the third insulating layer, and the second conductive transfer part is electrically connected to the first conductive connection part through a fourth via hole penetrating through the second insulating layer and the third insulating layer, so that the on-off control line is electrically connected to the gate electrode of the first transistor.

In at least one embodiment of the present disclosure, the conductive layer may be made of ITO (Indium Tin Oxide).

It should be noted that, in the embodiments of the present disclosure, the "same layer" may refer to a film layer on the same structural layer. Alternatively, for example, the film layers in the same layer may be a layer structure formed by using the same film forming process to form a film layer for forming a specific pattern, and then using the same mask to pattern the film layer through a single patterning process. Depending on the specific pattern, the single patterning process may include multiple times of exposures, developments or etching processes, and the specific pattern in the formed layer structure may be continuous or discontinuous. In addition, these specific patterns may also be at different heights or have different thicknesses.

Optionally, the driving circuit further includes a fourth transistor and a twelfth transistor;
the first transistor and the fourth transistor are arranged in a first direction, or the first transistor and the twelfth transistor are arranged in the first direction.

In a specific embodiment, the first transistor and the fourth transistor included in the driving circuit are arranged in the first direction, or the first transistor and the twelfth transistor included in the driving circuit are arranged in the first direction, so as to narrow the width of the peripheral region in the second direction, which is beneficial to realize a narrow frame.

In at least one embodiment of the present disclosure, the first direction the and the second direction intersects each other, and multiple rows of gate lines and multiple columns of data lines are arranged in the display region; the first direction may be approximately the same direction as the extending direction of the data lines, and the second direction may be approximately the same direction as the extending direction of the gate lines.

In the specific embodiment, the third node control circuit further may include the second transistor; the second transistor includes a comb-shaped first electrode and a comb-shaped second electrode; the first electrode of the first transistor, the first electrode of the second transistor, and the second electrode of the second transistor are arranged at a same layer;
the first electrode of the second transistor includes a plurality of third comb-tooth electrode parts and a third comb-handle electrode part connected to the plurality of third comb-tooth electrode parts;
the second electrode of the second transistor includes a plurality of fourth comb-tooth electrode parts and a fourth comb-handle electrode part connected to the plurality of fourth comb-tooth electrode parts;
the third comb-tooth electrode parts and the fourth comb-tooth electrode parts are arranged at intervals;
the third comb-handle electrode part is electrically connected to the first comb-handle electrode part, and the fourth comb-handle electrode part is electrically connected to the second comb-handle electrode part.

Figure 15:
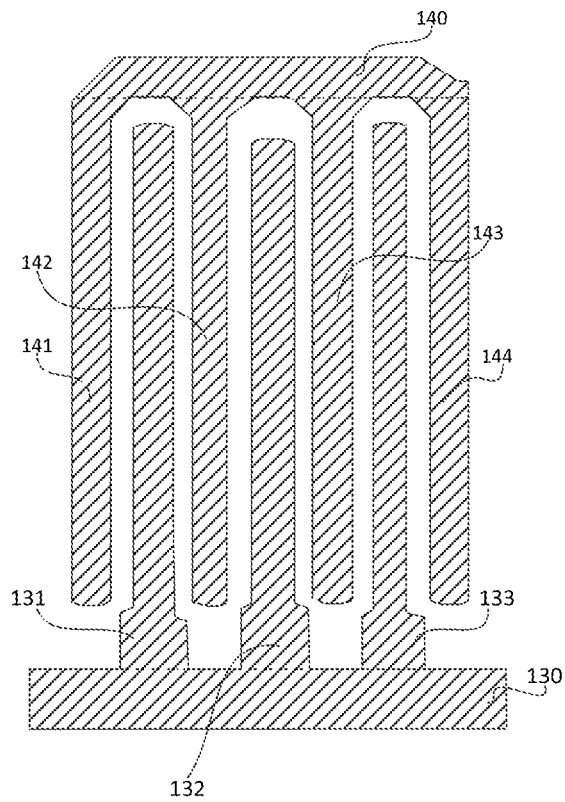
FIG. 15 is a structural view of an embodiment of a first electrode and a second electrode of a second transistor in the driving circuit of the display substrate according to the present disclosure.

As shown in FIG. 15, the first electrode of the second transistor includes a third comb-tooth electrode part 131 being the first one, a third comb-tooth electrode part 132 being the second one, a third comb-tooth electrode part 133 being the third one, and a third comb-handle electrode part 130 that are electrically connected to each other;
the second electrode of the second transistor includes a fourth comb-tooth electrode part 141 being the first one, a fourth comb-tooth electrode part 142 being the second one, a second comb-tooth electrode part 143 being the fourth one, a fourth comb-tooth electrode part 144 being the fourth one and a comb-handle electrode part 140;
the fourth comb-tooth electrode part 141 being the first one, the third comb-tooth electrode part 131 being the first one, the fourth comb-tooth electrode part 142 being the second one, the third comb-tooth electrode part 132 being the second one, the fourth comb-tooth electrode part 143 being the third one, the third comb-tooth electrode part 133 being the third one and the fourth comb-tooth electrode part 144 being the fourth one are arranged in sequence in the second direction.

In an embodiment of the present disclosure, the first transistor and the second transistor may be arranged in a second direction;
the second direction and the first direction intersects each other.

Optionally, the on-off control line includes the first on-off control line and the second on-off control line arranged at a same layer; the first on-off control line extends in the first direction, the second on-off control line extends in the first direction;
the first transistor and the second transistor further include the respective gate electrodes, and the gate electrodes and the first on-off control line are arranged at a same layer; the display substrate further includes the first conductive connection part, a second conductive connection part, the first conductive transfer part, the second conductive transfer part, the third conductive connection part, the fourth conductive connection part, the third conductive transfer part and the fourth conductive transfer part; the first conductive transfer part, the second conductive transfer part, the third conductive transfer part and the fourth conductive transfer part are arranged at a same layer;

the first conductive connection part and the gate electrode of the first transistor are arranged at a same layer and electrically connected to each other, the second conductive connection part and the first electrode of the first transistor are arranged at a same layer, and the first conductive transfer part, the first conductive connection part and the second conductive connection part are arranged at respective different layers;

the first on-off control line is electrically connected to the first conductive transfer part through the first via hole, and the first conductive transfer part is electrically connected to the second conductive connection part through the second via hole, the second conductive connection part is electrically connected to the second conductive transfer part through a third via hole, and the second conductive transfer part is electrically connected to the first conductive connection part through a fourth via hole, so that the gate electrode of the first transistor is electrically connected to the first on-off control line;

the third conductive connection part and the gate electrode of the second transistor are arranged at a same layer and electrically connected to each other, the fourth conductive connection part and the first electrode of the second transistor are arranged at a same layer, and the third conductive transfer part, the third conductive connection part and the fourth conductive connection part are arranged at respective different layers;

the second on-off control line is electrically connected to the third conductive transfer part through a fifth via hole, and the third conductive transfer part is electrically connected to the fourth conductive connection part through a sixth via hole, the fourth conductive connection part is electrically connected to the fourth conductive transfer part through a seventh via hole, and the fourth conductive transfer part is electrically connected to the third conductive connection part through an eighth via hole, so that the gate electrode of the second transistor is electrically connected to the second on-off control line.

Optionally, the display substrate may include an active layer, a first insulating layer, a gate metal layer, a second insulating layer, a source/drain metal layer, a third insulating layer, and a conductive layer sequentially arranged on the substrate;

the patterning process is performed on the gate metal layer to form the gate electrode of the transistor in the driving circuit, the clock signal line, the high-voltage line, the low-voltage line, the first on-off control line, the second on-off control line, the first conductive connection part, and the third conductive connection part, and the patterning process is performed on the source/drain metal layer to form the first electrode of the transistor in the driving circuit, the second electrode of the transistor in the driving circuit, the second conductive connection part and the fourth conductive connection part, and the patterning process is performed on the conductive layer to form the first conductive transfer part, the second conductive transfer part, the third conductive connection part and the fourth conductive connection part;

the first on-off control line is electrically connected to the first conductive transfer part through the first via hole penetrating through the second insulating layer and the third insulating layer, and the first conductive transfer part is electrically connected to the second conductive connection part through the second via hole penetrating through the third insulating layer, the second conductive connection part is electrically connected to the second conductive transfer part through a third via hole penetrating through the third insulating layer, and the second conductive transfer part is electrically connected to the first conductive connection part through a fourth via hole penetrating through the second insulating layer and the third insulating layer, so that the first on-off control line is electrically connected to the gate electrode of the first transistor;

the second on-off control line is electrically connected to the third conductive transfer part through the fifth via hole penetrating through the second insulating layer and the third insulating layer, and the third conductive transfer part is electrically connected to the fourth conductive connection part through the sixth via hole penetrating through the third insulating layer, the fourth conductive connection part is electrically connected to the fourth conductive transfer part through a seventh via hole penetrating through the third insulating layer, and the fourth conductive transfer part is electrically connected to the third conductive connection part through an eighth via hole penetrating through the second insulating layer and the third insulating layer, so that the second on-off control line is electrically connected to the gate electrode of the second transistor.

In a specific embodiment, the driving circuit further may include a fourth transistor and a twelfth transistor;

the first transistor and the fourth transistor are arranged in the first direction, and the second transistor and the twelfth transistor are arranged in the first direction; or the first transistor and the twelfth transistor are arranged in the first direction, and the second transistor and the fourth transistor are arranged in the first direction.

As a result, it is able to narrow the width of the peripheral region in the second direction, which is beneficial to realize a narrow frame.

Figure 13:
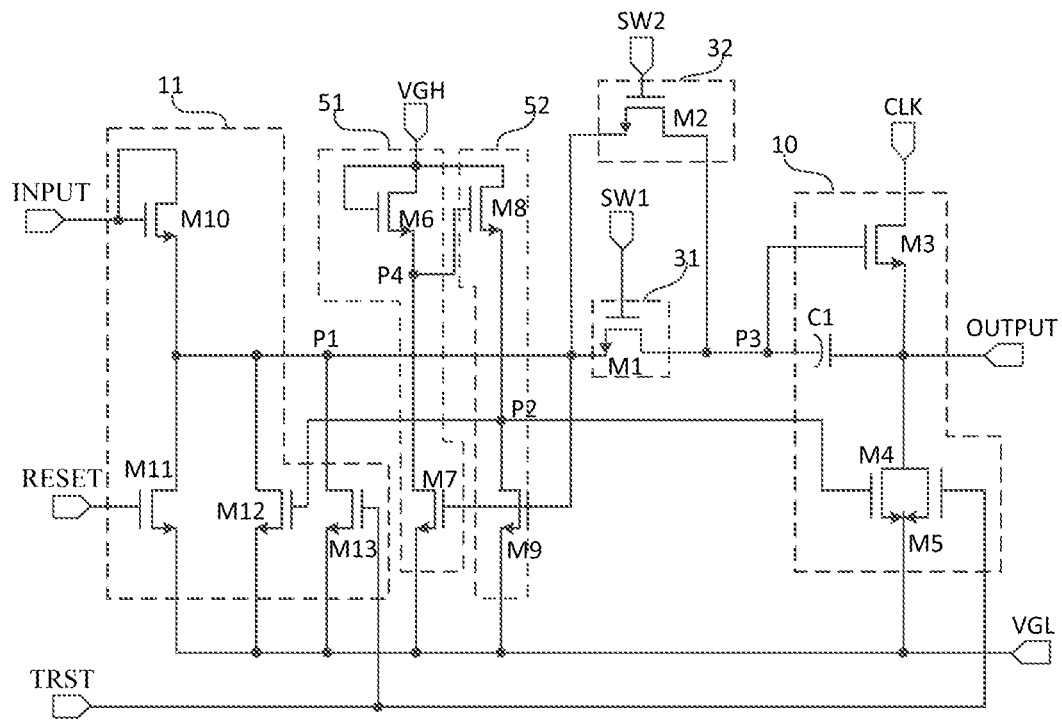
FIG. 13 is a structural view of the driving circuit described in an embodiment of the present disclosure.
Figure 16:
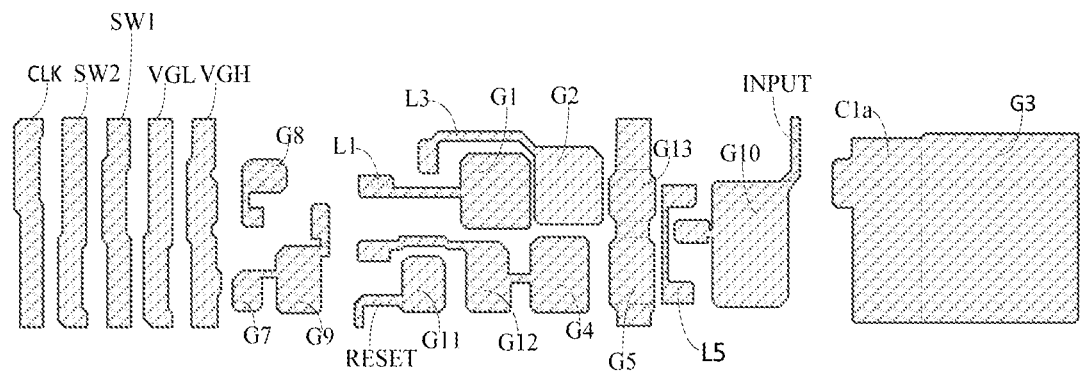
FIG. 16 is a layout view of a gate metal layer in FIG. 20.
Figure 17:
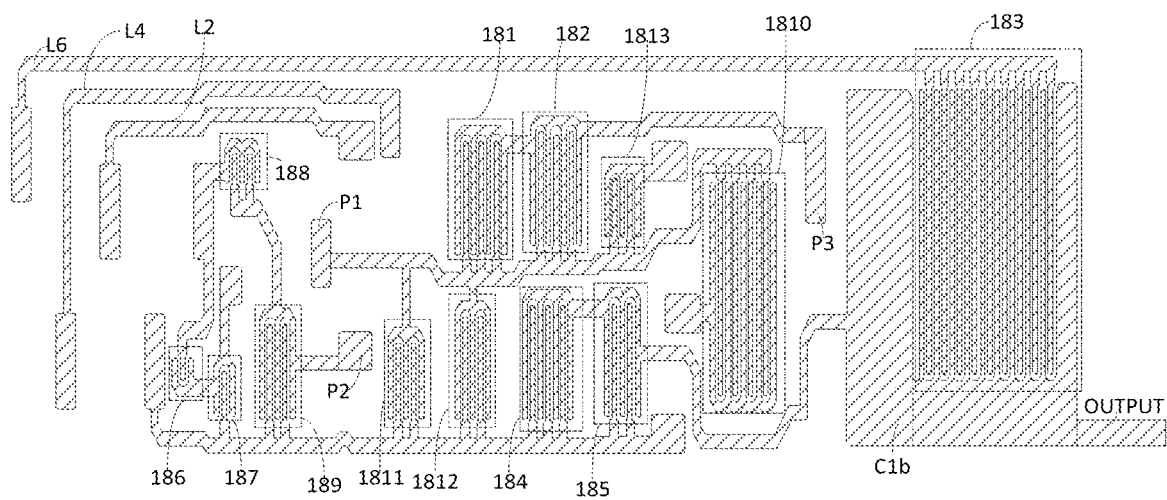
FIG. 17 is a layout view of a source/drain metal layer in FIG. 20.
Figure 18:
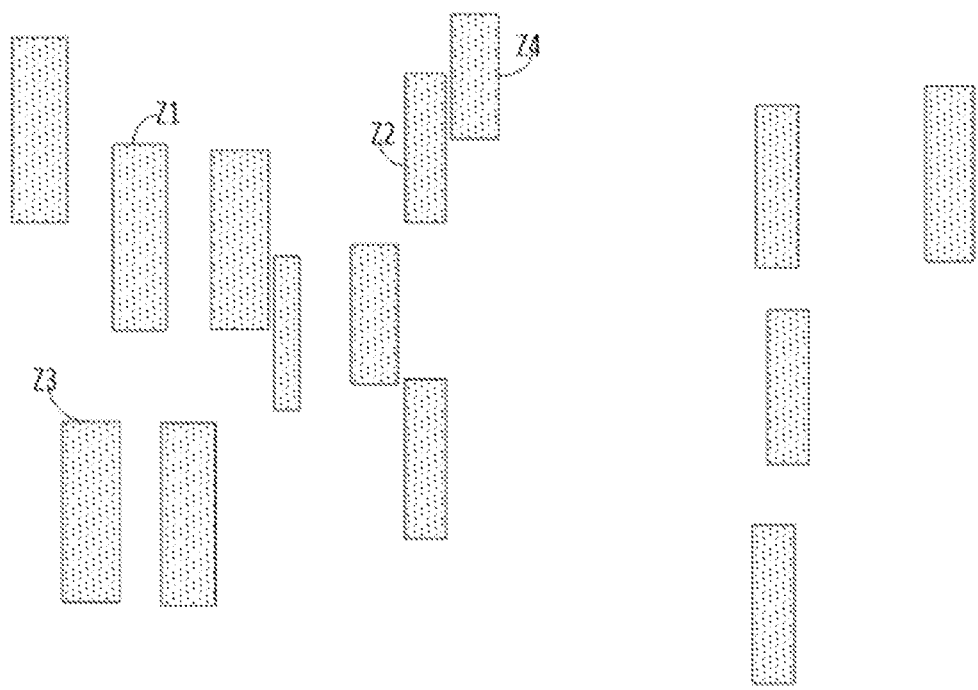
FIG. 18 is a layout view of a conductive layer in FIG. 20.
Figure 19:
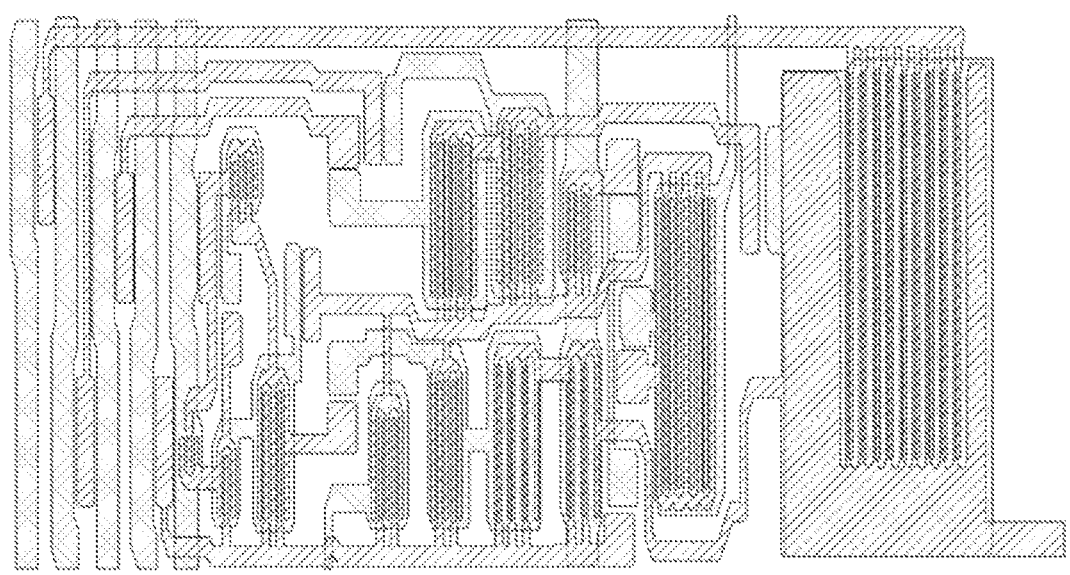
FIG. 19 is a layout view after superposition of the gate metal layer and the source/drain metal layer in FIG. 20.
Figure 20:
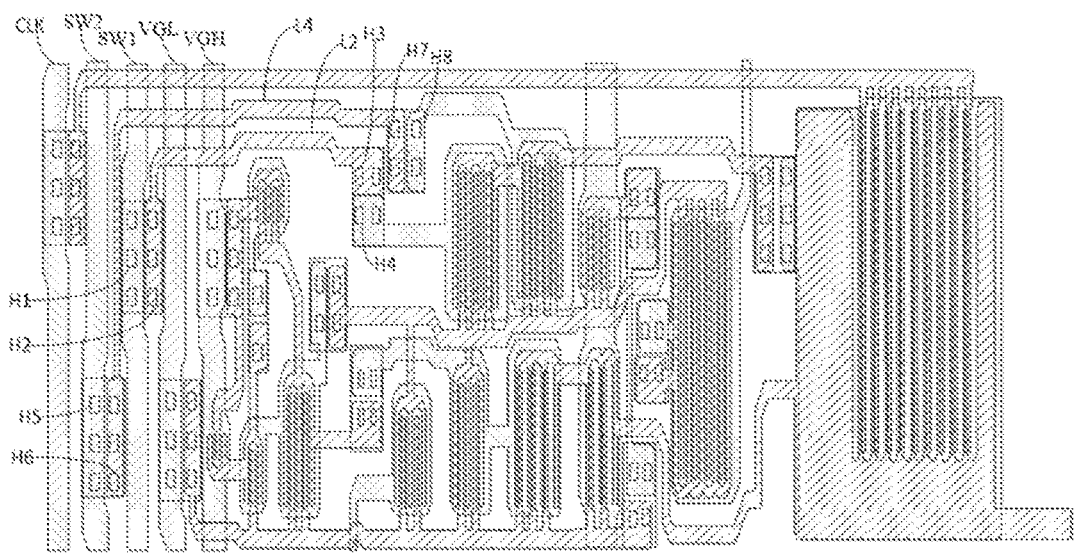
FIG. 20 is a layout view corresponding to the embodiment of the driving circuit shown in FIG. 13 (in FIG. 20, the gate metal layer, the source/drain metal layer, the conductive layer, and a via hole are shown)
Figure 21:
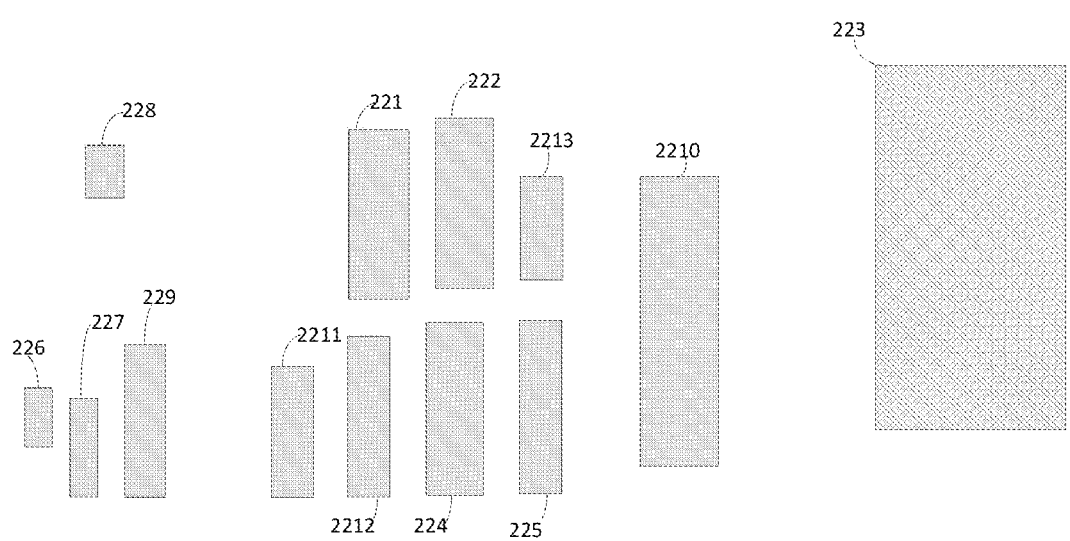
FIG. 21 is a layout view of an active layer.

FIG. 20 is a layout view corresponding to an embodiment of the driving circuit shown in FIG. 13 (in FIG. 20, the gate metal layer, source/drain metal layer, conductive layer and via hole are shown). FIG. 16 is a layout view of the gate metal layer in FIG. 20, FIG. 17 is a layout view of the source/drain metal layer in FIG. 20, FIG. 18 is a layout view of the conductive layer in FIG. 20, FIG. 19 is a layout view after superposition of the gate metal layer and the source/drain metal layer in FIG. 20. FIG. 21 is a layout view of an active layer.

In FIG. 16, the label G1 indicates the gate electrode of the first transistor, the label L1 indicates the first conductive connection part, the label G2 indicates the gate electrode of the second transistor, the label L3 indicates the third conductive connection part, the label SW1 indicates the first on-off control line, the label SW2 indicates the second on-off control line, the label VGL indicates the low-voltage line, and the label VGH indicates the high-voltage line.

In FIG. 17, the label L2 indicates the second conductive connection part, the label L4 indicates the fourth conductive connection part, and the label 181 indicates the electrode unit included in T1, the electrode unit 181 included in T1 includes the first electrode of T1 and the second electrode of T1 in FIG. 13, the label 182 indicates the electrode unit included in T2, and the electrode unit 182 of T2 includes the first electrode of T2 and the second electrode of T2 in FIG. 13.

In FIG. 18, the label Z1 indicates the first conductive transfer part, the label Z2 indicates the second conductive transfer part, the label Z3 indicates the third conductive transfer part, and the label Z4 indicates the fourth conductive transfer part.

In FIG. 20, the label H1 indicates the first via hole, the label H2 indicates the second via hole, the label H3 indicates the third via hole, the label H4 indicates the fourth via hole, and the label H5 indicates the fifth via hole, the label H6 indicates the sixth via hole, the label H7 indicates the seventh via hole, and the label H8 indicates the eighth via hole.

As shown in FIG. 20, the first on-off control line SW1 is electrically connected to the first conductive transfer part Z1 through the first via hole H1, the first conductive transfer part Z1 is electrically connected to the second conductive connection part L2 through the second via hole H2, the second conductive connection part L2 is electrically connected to the second conductive transfer part Z2 through the third via hole H3, the second conductive transfer part Z2 is electrically connected to the first conductive connection part L1 through the fourth via hole H4, so that the gate electrode G1 of the first transistor is electrically connected to the first on-off control line SW1;

the second on-off control line SW2 is electrically connected to the third conductive transfer part Z3 through the fifth via hole H5, the third conductive transfer part Z3 is electrically connected to the fourth conductive connection part L4 through the sixth via hole H6, and the fourth conductive connection part L4 is electrically connected to the fourth conductive transfer part Z4 through the seventh via hole H7, and the fourth conductive transfer part Z4 is electrically connected to the third conductive connection part L3 through the eighth via hole H8, so that the gate electrode G2 of the second transistor is electrically connected to the second on-off control line SW2.

As shown in FIG. 17, both the first electrodes of the transistors in the driving circuit and the second electrodes of the transistors in the driving circuit are comb-shaped electrodes.

In FIG. 17, the label 181 indicates an electrode unit included in M1, and the electrode unit 181 included in M1 includes a first electrode of M1 and a second electrode of M1;

the label 182 indicates an electrode unit included in M2, and the electrode unit 182 included in M2 includes a first electrode of M2 and a second electrode of M2;

the label 183 indicates an electrode unit included in M3, and the electrode unit 183 included in M3 includes a first electrode of M3 and a second electrode of M3;

the label 184 indicates an electrode unit included in M4, and the electrode unit 184 included in M4 includes a first electrode of M4 and a second electrode of M4;

the label 185 indicates an electrode unit included in M5, and the electrode unit 185 included in M5 includes a first electrode of M and a second electrode of M5;

the label 186 indicates an electrode unit included in M6, and the electrode unit 186 included in M6 includes a first electrode of M6 and a second electrode of M6;

the label 187 indicates an electrode unit included in M7, and the electrode unit 187 included in M7 includes a first electrode of M7 and a second electrode of M7;

the label 188 indicates an electrode unit included in M8, and the electrode unit 188 included in M8 includes a first electrode of M8 and a second electrode of M8;

the label 189 indicates an electrode unit included in M9, and the electrode unit 189 included in M9 includes a first electrode of M9 and a second electrode of M9;

the label 1810 indicates an electrode unit included in M10, and the electrode unit 1810 included in M10 includes a first electrode of M10 and a second electrode of M10;

the label 1811 indicates an electrode unit included in M11, and the electrode unit 1811 included in M11 includes a first electrode of M11 and a second electrode of M11;

the label 1812 indicates an electrode unit included in M12, and the electrode unit 1812 included in M12 includes a first electrode of M12 and a second electrode of M12; and the label 1813 indicates an electrode unit included in M13, and the electrode unit 1813 included in M13 includes a first electrode of M13 and a second electrode of M13.

In FIG. 17, the label C1b indicates a second plate of C1, and the label OUTPUT indicates a driving signal terminal.

In FIG. 17, the label L6 indicates the sixth conductive connection part, and the sixth conductive connection part L6 is configured for electrically connecting the clock signal line CLK and the second electrode of M3.

In FIG. 16, the label G3 indicates the gate electrode of M3, the label G4 indicates the gate electrode of M4, the label G5 indicates the gate electrode of M5, the label G7 indicates the gate electrode of M7, and the label G8 indicates the gate electrode of M8, the label G9 indicates the gate electrode of M9, the label G10 indicates the gate electrode of M10, the label G11 indicates the gate electrode of M11, the label G12 indicates the gate electrode of M12, and the label G13 indicates the gate electrode of M13.

As shown in FIG. 16, the high-voltage line VGH further serve as the gate electrode of M6, and the frame reset line further serves as the gate electrode G13 of M13 and the gate electrode G5 of M5.

As shown in FIG. 16, the gate electrode G3 of M3 is electrically connected to the first plate C1a of C1, the gate electrode G11 of M11 is electrically connected to the reset terminal RESET, and the gate electrode G10 of M10 is electrically connected to the input terminal INPUT.

In FIG. 16, the label L5 indicates a fifth conductive connection part; L5 is configured for electrically connecting the first electrode of the fifth transistor and the second electrode of the thirteenth transistor.

As shown in FIG. 16, the gate electrode of M1 and the gate electrode of M12 are arranged in the first direction, and the gate electrode of M2 and the gate electrode of M4 are arranged in the first direction;

As shown in FIG. 17, the electrode unit 181 of M1 and the electrode unit 1812 of M12 are arranged in the first direction, and the electrode unit 182 of M2 and the electrode unit 184 of M4 are arranged in the first direction;

as a result, M1 and M12 are arranged in the first direction, and M2 and M4 are arranged in the first direction, so as to narrow the width of the peripheral region in the second direction, which is beneficial to realize a narrow frame.

As shown in FIG. 17, the second plate C1b of C1 is electrically connected to the first electrode of M3 in the electrode unit 183 of M3, and the second plate C1b of C1 is electrically connected to the driving signal terminal OUTPUT.

As shown in FIG. 17, the first electrode of M1, the first electrode of M2, the first electrode of M13 and the second electrode of M10 are all electrically connected to the third node P3;

the second electrode of M1, the second electrode of M2, the first electrode of M12 and the first electrode of M11 are all electrically connected to the first node P1;

the second electrode of M8 and the first electrode of M9 are electrically connected to the second node P2.

In FIG. 21, the label 221 indicates an active layer pattern of M1, the label 222 indicates an active layer pattern of M2, the label 223 indicates an active layer pattern of M3, the label 224 indicates an active layer pattern of M4, the label 225 indicates an active layer pattern of M5, the label 226 indicates an active layer pattern of M6, the label 227 indicates an active layer pattern of M7, the label 228 indicates an active layer pattern of M8, the label 229 indicates an active layer pattern of M9, the label 210 indicates an active layer pattern of M10, the label 211 indicates an active layer pattern of M11, the label 212 indicates an active layer pattern of M12, and the label 213 indicates an active layer pattern of M13.

A display device described in at least one embodiment of the present disclosure includes the above-mentioned driving circuit, or the display device described in at least one embodiment of the present disclosure includes the above-mentioned display substrate.

The display device provided by the embodiments of the present disclosure may be any product or component with a display function, such as a mobile phone, a tablet computer, a television, a monitor, a notebook computer, a digital photo frame, or a navigator.

The above are preferred embodiments of the present disclosure. It should be noted that a person skilled in the art may implement various improvements and modifications without departing from the principle of the present disclosure. These improvements and modifications should also fall within the protection scope of the present disclosure.

What is claimed is:

1. A driving circuit, comprising a first node control circuit, a second node control circuit, a third node control circuit and an output circuit, wherein the first node control circuit is electrically connected to a first node, and configured for controlling a potential of the first node;

the second node control circuit is electrically connected to a second node, and configured for controlling a potential of the second node;

the third node control circuit is electrically connected to an on-off control line, the first node and a third node, and configured for controlling, under control of an on-off control signal provided by the on-off control line, the first node to be electrically connected to the third node or the first node to be electrically disconnected from the third node;

the output circuit is electrically connected to the second node, the third node and a driving signal terminal, and configured for controlling, under control of the potential of the second node and a potential of the third node, output of a driving signal through the driving signal terminal;

the on-off control line comprises a first on-off control line and a second on-off control line; the third node control circuit comprises a first control sub-circuit and a second control sub-circuit;

the first control sub-circuit is electrically connected to the first on-off control line, the first node and the third node, and configured for controlling, under control of a first on-off control signal provided by the first on-off control line, the first node to be electrically connected to the third node or the first node to be electrically disconnected from the third node;

the second control sub-circuit is electrically connected to the second on-off control line, the first node and the third node, and configured for controlling, under control of a second on-off control signal provided by the second on-off control line, the first node to be electrically connected to the third node or the first node to be electrically disconnected from the third node.

2. The driving circuit according to claim 1, wherein the third node control circuit comprises a first transistor, wherein a gate electrode of the first transistor is electrically connected to the on-off control line, a first electrode of the first transistor is electrically connected to the first node, and a second electrode of the first transistor is electrically connected to the third node.

3. The driving circuit according to claim 1, wherein the first control sub-circuit comprises a first transistor, and the second control sub-circuit comprises a second transistor;

a gate electrode of the first transistor is electrically connected to the first on-off control line, a first electrode of the first transistor is electrically connected to the first node, and a second electrode of the first transistor is electrically connected to the third node;

a gate electrode of the second transistor is electrically connected to the second on-off control line, a first electrode of the second transistor is electrically connected to the first node, and a second electrode of the second transistor is electrically connected to the third node.

4. The driving circuit according to claim 1, wherein the output circuit comprises a third transistor, a fourth transistor and a storage capacitor;

a gate electrode of the third transistor is electrically connected to the third node, a second electrode of the third transistor is electrically connected to a clock signal line, and a first electrode of the third transistor is electrically connected to the driving signal terminal;

a gate electrode of the fourth transistor is electrically connected to the second node, a first electrode of the fourth transistor is electrically connected to the driving signal terminal, and a second electrode of the fourth transistor is electrically connected to a first voltage line;

a first plate of the storage capacitor is electrically connected to the third node, and a second plate of the storage capacitor is electrically connected to the driving signal terminal.

5. The driving circuit according to claim 4, wherein the output circuit further comprises a fifth transistor;

a gate electrode of the fifth transistor is electrically connected to a frame reset line, a second electrode of the fifth transistor is electrically connected to the driving signal terminal, and a first electrode of the fifth transistor is electrically connected to the first voltage line.

6. The driving circuit according to claim 1, wherein the second node control circuit comprises a fourth node control sub-circuit and a second node control sub-circuit;

the fourth node control sub-circuit is electrically connected to a second voltage line, a fourth node and a first voltage line, and the fourth node control sub-circuit is further electrically connected to the first node or the third node, and configured for controlling, under control of a second voltage signal provided by the second voltage line, the fourth node to be electrically connected to the second voltage line, and controlling, under control of the potential of the first node or the potential of the third node, the fourth node to be electrically connected to the first voltage line;

the second node control sub-circuit is electrically connected to the fourth node, the second voltage line, the second node and the first voltage line, and the second node control sub-circuit is further electrically connected to the first node or the third node, and configured for controlling, under control of a potential of the fourth node, the second node to be electrically connected to the second voltage line, and controlling, under control of the potential of the first node or the potential of the third node, the second node to be electrically connected to the first voltage line.

7. The driving circuit according to claim 6, wherein the fourth node control sub-circuit comprises a sixth transistor and a seventh transistor;

a gate electrode of the sixth transistor is electrically connected to a first electrode of the sixth transistor and the second voltage line, and a second electrode of the sixth transistor is electrically connected to the fourth node;

a gate electrode of the seventh transistor is electrically connected to the first node or the third node, a first electrode of the seventh transistor is electrically connected to the fourth node, and a second electrode of the seventh transistor is electrically connected to the first voltage line;

the second node control sub-circuit comprises an eighth transistor and a ninth transistor;

a gate electrode of the eighth transistor is electrically connected to the fourth node, a first electrode of the eighth transistor is electrically connected to the second voltage line, and a second electrode of the eighth transistor is electrically connected to the second node;

a gate electrode of the ninth transistor is electrically connected to the first node or the third node, a first electrode of the ninth transistor is electrically connected to the second node, and a second electrode of the ninth transistor is electrically connected to the first voltage line.

8. The driving circuit according to claim 1, wherein the first node control circuit is electrically connected to an input terminal, a reset terminal, a frame reset line, the second node, the first node and a first voltage line, and configured for controlling, under control of an input signal provided by the input terminal, the input terminal to be electrically connected to the first node, controlling, under control of a reset signal provided by the reset terminal, the first node to be electrically connected to the first voltage line, controlling, under control of the potential of the second node, the first node to be electrically connected to the first voltage line, and controlling, under control of a frame reset signal provided by the frame reset line, the first node to be electrically connected to the first voltage line, wherein the first node control circuit comprises a tenth transistor, an eleventh transistor, a twelfth transistor and a thirteenth transistor;

a gate electrode of the tenth transistor and a first electrode of the tenth transistor are both electrically connected to the input terminal, and a second electrode of the tenth transistor is electrically connected to the first node;

a gate electrode of the eleventh transistor is electrically connected to the reset terminal, a first electrode of the eleventh transistor is electrically connected to the first node, and a second electrode of the eleventh transistor is electrically connected to the first voltage line;

a gate electrode of the twelfth transistor is electrically connected to the second node, a first electrode of the twelfth transistor is electrically connected to the first node, and a second electrode of the twelfth transistor is electrically connected to the first voltage line;

a gate electrode of the thirteenth transistor is electrically connected to the frame reset line, a first electrode of the thirteenth transistor is electrically connected to the first node, and a second electrode of the thirteenth transistor is electrically connected to the first voltage line.

9. A driving method, performed by the driving circuit according to claim 1, wherein the driving method comprises:

in a display stage, controlling, by the third node control circuit under control of the on-off control signal, the first node to be electrically connected to the third node; and in a touch stage, controlling, by the third node control circuit under control of the on-off control signal, the first node to be electrically disconnected from the third node.

10. The driving method according to claim 9, wherein the step of controlling, by the third node control circuit under control of the on-off control signal, the first node to be electrically disconnected from the third node comprises:

controlling, by the first control sub-circuit under control of the first on-off control signal, the first node to be electrically disconnected from the third node, and controlling, by the second control sub-circuit under control of the second on-off control signal, the first node to be electrically disconnected from the third node.

11. A display substrate, comprising a display region arranged on a substrate and a driving module arranged on a peripheral region of the substrate, wherein the driving module comprises multi-stage driving circuits each according to claim 1;

the third node control circuit is arranged at a side of the output circuit distal to the display region, and the on-off control line is arranged at a side of the third node control circuit distal to the output circuit.

12. The display substrate according to claim 11, wherein the third node control circuit comprises the first transistor;

the first transistor comprises a first electrode and a second electrode arranged in a same layer, each of the first electrode and the second electrode of the first transistor is of a comb shape;

the first electrode of the first transistor comprises a plurality of first comb-tooth electrode parts and a first comb-handle electrode part connected to the plurality of first comb-tooth electrode parts;

the second electrode of the first transistor comprises a plurality of second comb-tooth electrode parts and a second comb-handle electrode part connected to the plurality of second comb-tooth electrode parts;

the first comb-tooth electrode parts and the second comb-tooth electrode parts are arranged at intervals.

13. The display substrate according to claim 12, wherein the on-off control line extends in a first direction; the first transistor further comprises a gate electrode, and the gate electrode of the first transistor and the on-off control line are arranged at a same layer; the display substrate further comprises a first conductive connection part, a second conductive connection part, a first conductive transfer part and a second conductive transfer part;

the first conductive connection part and the gate electrode of the first transistor are arranged at a same layer and electrically connected to each other, the second conductive connection part and the first electrode of the first transistor are arranged at a same layer, the first conductive transfer part and the second conductive transfer part are arranged at a same layer, and the first conductive transfer part, the first conductive connection part and the second conductive connection part are arranged at respective different layers;

the on-off control line is electrically connected to the first conductive transfer part through a first via hole, and the first conductive transfer part is electrically connected to the second conductive connection part through a second via hole, the second conductive connection part is electrically connected to the second conductive transfer part through a third via hole, and the second conductive transfer part is electrically connected to the first conductive connection part through a fourth via hole, so as to enable the gate electrode of the first transistor to be electrically connected to the on-off control line.

14. The display substrate according to claim 13, wherein the driving circuit further comprises a fourth transistor and a twelfth transistor;

the first transistor and the fourth transistor are arranged in a first direction, or the first transistor and the twelfth transistor are arranged in the first direction.

15. The display substrate according to claim 12, wherein the third node control circuit further comprises the second transistor; the second transistor comprises a first electrode and a second electrode, each of the first electrode and the second electrode of the second transistor is of a comb shape; the first electrode of the first transistor, the first electrode of the second transistor, and the second electrode of the second transistor are arranged at a same layer;

the first electrode of the second transistor comprises a plurality of third comb-tooth electrode parts and a third comb-handle electrode part connected to the plurality of third comb-tooth electrode parts;

the second electrode of the second transistor comprises a plurality of fourth comb-tooth electrode parts and a fourth comb-handle electrode part connected to the plurality of fourth comb-tooth electrode parts;

the third comb-tooth electrode parts and the fourth comb-tooth electrode parts are arranged at intervals;

the third comb-handle electrode part is electrically connected to the first comb-handle electrode part, and the fourth comb-handle electrode part is electrically connected to the second comb-handle electrode part.

16. The display substrate according to claim 15, wherein the first transistor and the second transistor are arranged in a second direction;

the second direction and the first direction intersects each other.

17. The display substrate according to claim 15, wherein the first on-off control line and the second on-off control line are arranged at a same layer; the first on-off control line extends in the first direction, the second on-off control line extends in the first direction;

the first transistor and the second transistor further comprise respective gate electrodes, and the gate electrodes of the first transistor and the second transistor and the first on-off control line are arranged at a same layer; the display substrate further comprises a first conductive connection part, a second conductive connection part, the first conductive transfer part, the second conductive transfer part, the third conductive connection part, the fourth conductive connection part, the third conductive transfer part and the fourth conductive transfer part; the first conductive transfer part, the second conductive transfer part, the third conductive transfer part and the fourth conductive transfer part are arranged at a same layer;

the first conductive connection part and the gate electrode of the first transistor are arranged at a same layer and electrically connected to each other, the second conductive connection part and the first electrode of the first transistor are arranged at a same layer, and the first conductive transfer part, the first conductive connection part and the second conductive connection part are arranged at respective different layers;

the first on-off control line is electrically connected to the first conductive transfer part through the first via hole, and the first conductive transfer part is electrically connected to the second conductive connection part through the second via hole, the second conductive connection part is electrically connected to the second conductive transfer part through a third via hole, and the second conductive transfer part is electrically connected to the first conductive connection part through a fourth via hole, to enable the gate electrode of the first transistor to be electrically connected to the first on-off control line;

the third conductive connection part and the gate electrode of the second transistor are arranged at a same layer and electrically connected to each other, the fourth conductive connection part and the first electrode of the second transistor are arranged at a same layer, and the third conductive transfer part, the third conductive connection part and the fourth conductive connection part are arranged at respective different layers;

the second on-off control line is electrically connected to the third conductive transfer part through a fifth via hole, and the third conductive transfer part is electrically connected to the fourth conductive connection part through a sixth via hole, the fourth conductive connection part is electrically connected to the fourth conductive transfer part through a seventh via hole, and the fourth conductive transfer part is electrically connected to the third conductive connection part through an eighth via hole, to enable the gate electrode of the second transistor to be electrically connected to the second on-off control line.

18. The display substrate according to claim 17, wherein the driving circuit further comprises a fourth transistor and a twelfth transistor;

the first transistor and the fourth transistor are arranged in the first direction, and the second transistor and the twelfth transistor are arranged in the first direction; or the first transistor and the twelfth transistor are arranged in the first direction, and the second transistor and the fourth transistor are arranged in the first direction.

19. A display device, comprising the driving circuit according to claim 1.

* * * * *